(12) United States Patent
Kaida et al.

(10) Patent No.: US 6,198,200 B1
(45) Date of Patent: Mar. 6, 2001

(54) THICKNESS EXTENSIONAL VIBRATION PIEZOELECTRIC RESONATOR AND PIEZOELECTRIC RESONANCE APPARATUS

(75) Inventors: Hiroaki Kaida, Moriyama; Toru Nagae, Omihachiman, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/433,808

(22) Filed: Nov. 3, 1999

(30) Foreign Application Priority Data

Dec. 17, 1998 (JP) .................................................. 10-359428

(51) Int. Cl.⁷ .................................................... H01L 41/04
(52) U.S. Cl. .......................... 310/320; 310/359; 310/366; 310/368
(58) Field of Search ..................... 310/320, 358, 310/359, 366, 367, 368

(56) References Cited

U.S. PATENT DOCUMENTS

| | | | |
|---|---|---|---|
| 4,900,970 | * | 2/1990 | Ando et al. ...................... 310/366 X |
| 4,918,350 | * | 4/1990 | Ando et al. ...................... 310/359 X |
| 4,939,403 | * | 7/1990 | Kittaka et al. .................... 310/359 X |
| 5,045,744 | * | 9/1991 | Ando et al. ............................ 310/320 |
| 5,065,066 | * | 11/1991 | Nakatani et al. ..................... 310/320 |
| 6,040,652 | * | 3/2000 | Kaida ..................................... 310/320 |
| 6,051,910 | * | 4/2000 | Kaida et al. ..................... 310/366 X |
| 6,051,916 | * | 4/2000 | Kaida et al. ........................... 310/368 |
| 6,107,727 | * | 8/2000 | Kaida et al. ........................... 310/366 |

* cited by examiner

Primary Examiner—Mark O. Budd
(74) Attorney, Agent, or Firm—Keating & Bennett, LLP

(57) ABSTRACT

A thickness extensional vibration piezoelectric resonator includes a strip-type, substantially rectangular plate-shaped piezoelectric body, first and second excitation electrodes disposed on both sides of the piezoelectric body, the back side and the front sides thereof being opposed to each other with the piezoelectric body disposed therebetween, and an internal electrode disposed in the piezoelectric body. The resonator portion where the first and second excitation electrodes and the internal electrode are opposed to each other define a resonance portion. In the longitudinal direction (a first direction) of the piezoelectric body, vibration-attenuating portions are provided on both sides of the resonance portion. The ratio L/D is within the range of about 9.0 to about 14.0, in which L is the length in the longitudinal direction of the piezoelectric body, T is the thickness, and wherein D=T/N.

20 Claims, 17 Drawing Sheets

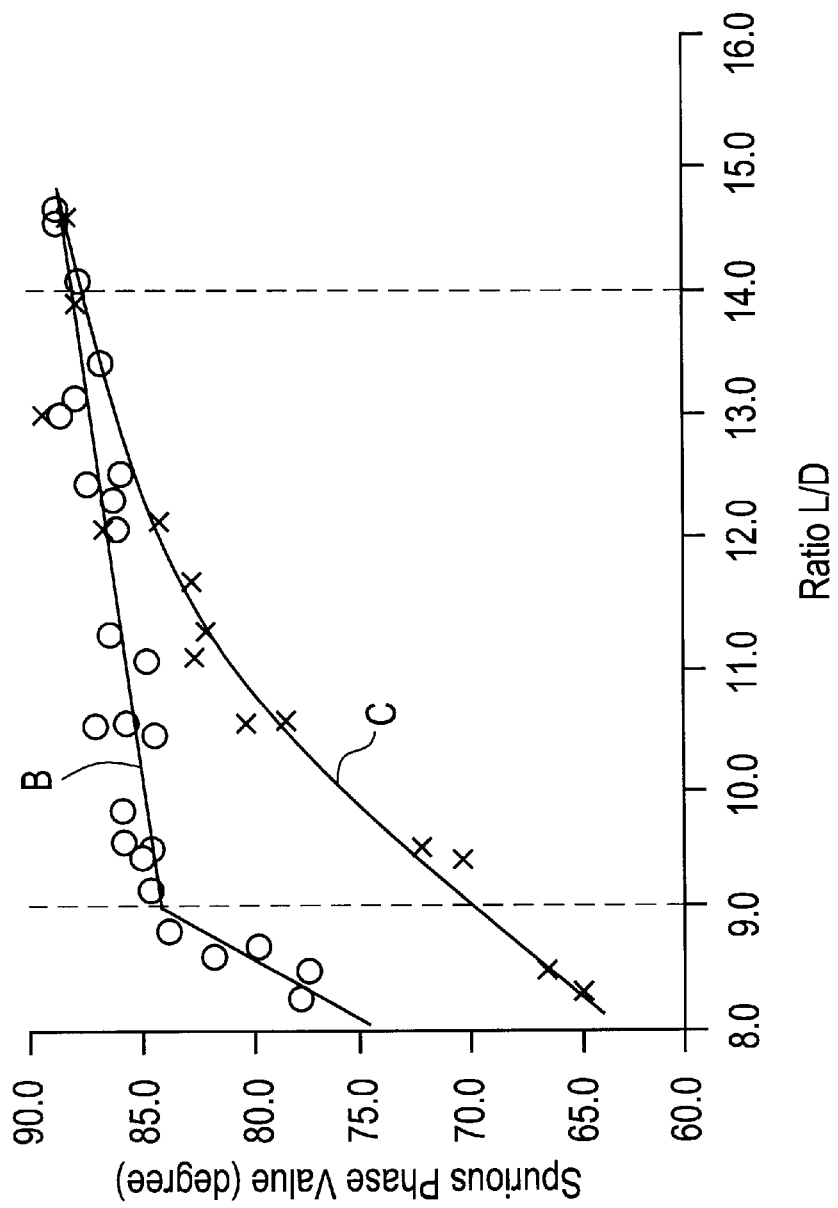

THICKNESS EXTENSIONAL VIBRATION PIEZOELECTRIC RESONATOR AND PIEZOELECTRIC RESONANCE APPARATUS

BACKGROUND OF THE INVENTION

1. Field of the Invention

The present invention relates to a piezoelectric resonator and a piezoelectric resonance apparatus for use in resonators, oscillators, or other electronic devices, and more particularly, to a thickness extensional vibration piezoelectric resonator and a piezoelectric resonance apparatus each operative to utilize higher harmonics in a thickness extensional vibration mode.

2. Description of the Related Art

Piezoelectric resonators are used in a variety of piezoelectric resonance apparatuses such as piezoelectric oscillators, piezoelectric filters, and so forth. Conventional piezoelectric resonators of this type are operative to utilize different piezoelectric vibration modes depending on the frequencies used.

Japanese Unexamined Patent Publication No. 1-117409 discloses an energy-trapping piezoelectric resonator operative to utilize the second harmonic in a thickness extensional vibration mode. This piezoelectric resonator will be described with reference to FIGS. 19 and 20.

The above-mentioned piezoelectric resonator is formed by laminating ceramic green sheets 61 and 62 made of a piezoelectric material, and firing the green sheets 61, 62 integrally, as shown in the exploded perspective view of FIG. 19. A circular excitation electrode 63 is located on the ceramic green sheet 61 at the center thereof. The excitation electrode 63 extends to one of the side edges of the ceramic green sheet 61 through an outgoing electrode 64. Further, a circular excitation electrode 65 is provided at the center of the upper side of the ceramic green sheet 62. The excitation electrode 65 extends to one of the side edges of the ceramic green sheet 62 through an outgoing electrode 66. Moreover, on the underside of the ceramic green sheet 62, an excitation electrode 67 is provided and extends to one of the side edges of the ceramic green sheet 62 through an outgoing electrode 68, as shown in the downward projection.

The above-mentioned ceramic green sheets 61 and 62 are laminated, pressed in the thickness direction, and then fired. The obtained sintered material is polarized so that a piezoelectric resonator 70 as shown in FIG. 20 is produced.

In the piezoelectric resonator 70, piezoelectric layers 71 and 72 defined by the sintered materials, are polarized evenly in the thickness direction indicated by the arrows in FIG. 23.

In operation, the piezoelectric resonator 70 is resonated by connecting in common the excitation electrodes 63 and 67 to apply an AC voltage between the excitation electrodes 63 and 67 and the excitation electrode 65. In this case, the vibration energy is trapped in the area where the excitation electrodes 63, 65, and 67 are overlapped, that is, a resonance portion A.

The conventional piezoelectric resonator 70 is operative to utilize higher harmonics in a thickness extensional vibration mode and is constructed to define an energy-trapping piezoelectric resonator, as described above. Accordingly, it is necessary to provide a vibration-attenuating portion on the periphery of the resonance portion A for attenuation of the vibration. That is, it is required to provide the vibration attenuating portion of which the area is larger than that of the resonance portion A. Therefore, it has been difficult to miniaturize the piezoelectric resonator 70.

On the other hand, Japanese Unexamined Patent Publication No. 2-235422 discloses an energy-trapping piezoelectric resonator containing a strip-type piezoelectric ceramic, in which it is not necessary to provide an piezoelectric substrate portion with a large area on the periphery of its resonance portion.

In the energy-trapping type piezoelectric resonator, an excitation electrode 82a is provided on the upper side of an elongated piezoelectric substrate 81, and an excitation electrode 82b is provided on the underside thereof, as shown in FIG. 21. Each of the excitation electrodes 82a and 82b is extended to a pair of the longer sides of the piezoelectric substrate 81 and extends over an entire width thereof. Further, the back side of the excitation electrode 82a and the front side of the excitation electrode 82b are opposed to each other in the center in the longitudinal direction of the piezoelectric substrate 81 so as to define a resonance portion. Further, the excitation electrodes 82a and 82b are extended to the ends 81a and 81b in the longitudinal direction of the piezoelectric substrate 81.

In the piezoelectric resonator 80, when the thickness extensional vibration mode is excited, unnecessary vibrations are generated, based on the dimensional relationship between the width W and the thickness T of the piezoelectric substrate 81. In Japanese Unexamined Patent Publication No. 2-235422, it is described that when the fundamental wave is utilized, the ratio of W/T of about 5.33 at a resonance frequency of 16 MHz is suitable, and when the third harmonic is utilized, unnecessary spurious components between the resonance frequency and the anti-resonance frequency can be reduced by setting the ratio of W/T at about 2.87 when the resonance frequency is about 16 MHz.

As described above, in the case of the energy-trapping piezoelectric resonator operative to utilize the second harmonic in a thickness extensional vibration mode, disclosed in Japanese Unexamined Patent Publication No. 1-117409, it is necessary to provide a large vibration attenuating portion on the periphery of its resonance portion. Accordingly, miniaturization of the energy-trapping type piezoelectric resonator is difficult.

Moreover, referring to the energy-trapping type piezoelectric resonator disclosed in Japanese Unexamined Patent Publication No. 2-235422, it is unnecessary to provide a vibration-attenuating portion on the side of the resonance portion, and therefore, miniaturization can be achieved. However, when higher harmonics in a thickness extensional vibration mode are practically utilized, spurious components appear between the resonance and anti-resonance frequencies. Accordingly, in some cases, effective resonance characteristics can not be obtained.

Referring to the piezoelectric resonator disclosed in Japanese Unexamined Patent Publication No. 2-235422, the electric capacity is relatively small so that the piezoelectric resonator is easily affected by a floating capacity generated from the circuit board or other components.

SUMMARY OF THE INVENTION

To overcome the problems described above, preferred embodiments of the present invention provide a thickness extensional vibration piezoelectric resonator and a piezoelectric resonance apparatus, each of which is operative to utilize higher harmonics in a thickness extensional vibration mode, has a greatly reduced size, has a large electric capacity, is not affected by a floating capacity generated by the circuit board or other components, effectively minimizes the generation of undesired unnecessary spurious components, and has excellent resonance characteristics.

Further, preferred embodiments of the present invention provide a thickness extensional vibration piezoelectric resonator and a piezoelectric resonance apparatus, each of which is operative to utilize the third harmonic in a thickness extensional vibration mode, has a greatly reduced size, has a large electric capacity, is not affected by a floating capacity generated by the circuit board or other components, effectively minimizes the generation of undesired unnecessary spurious components, and has excellent resonance characteristics.

One preferred embodiment of the present invention provides a thickness extensional vibration piezoelectric resonator having vibration-attenuating portions on both sides of a resonance portion and being arranged to be vibrated in N-order higher harmonics in a thickness extensional vibration mode. The thickness extensional vibration piezoelectric resonator includes a piezoelectric body, first and second excitation electrodes disposed on a pair of major surfaces of the piezoelectric body and arranged opposite to each other with the piezoelectric body disposed therebetween, and at least one layer of an internal electrode arranged inside of the piezoelectric body and at least partially opposed to the first excitation electrode and the second excitation electrode with the piezoelectric layers being disposed therebetween, the resonance portion being defined by the resonator portion where the first and second excitation electrodes and the internal electrode are overlapped in the thickness direction of the resonator, the first and second excitation electrodes being extended to or near to the side edges of the piezoelectric body in a direction that is substantially perpendicular to a first direction, the first direction being defined as the direction passing through both of the vibration-attenuating portions located on both sides of the resonance portion, the piezoelectric body having a ratio L/D in the range of about 9.0 to about 14.0 in which L represents the length in the first direction of the piezoelectric body, T represents the thickness thereof, and where $D=T/N$, and N represents the order of higher harmonics in a thickness extensional vibration mode to be utilized.

The above described thickness extensional vibration piezoelectric resonator preferably includes the piezoelectric body, the first and second excitation electrodes provided on the pair of major surfaces of the piezoelectric body, and one layer defining an internal electrode. Accordingly, as compared with the conventional thickness extensional vibration piezoelectric resonator having no internal electrodes, the electric capacity is greatly increased to a degree corresponding to the internal electrode, and thereby, hazardous influences that are caused by a floating capacity generated by the circuit board, to which the thickness extensional vibration piezoelectric resonator is attached, are greatly reduced.

Moreover, the ratio L/D is preferably within a range of about 9.0 to about 14.0. Accordingly, miniaturization of the resonator or resonance apparatus is achieved, and spurious components appearing between the resonance and anti-resonance frequencies are effectively suppressed and minimized by holding the sides of the piezoelectric body which extend in a direction that is substantially perpendicular to the vibration direction of higher harmonics producing the thickness extensional vibration, at both ends in the first direction of the piezoelectric body.

Accordingly, an energy-trapping type thickness extensional vibration piezoelectric resonator operative to utilize higher harmonics in a thickness extensional vibration mode and having excellent resonance characteristics is achieved.

Further, the vibration-attenuating portions are preferably provided on both sides of the resonance portion only in the first direction. That is, no vibration attenuating portions are arranged in a direction that is substantially perpendicular to the first direction. In addition, the ratio L/D is preferably about 14 or higher. Therefore, the thickness extensional vibration piezoelectric resonator is significantly miniaturized.

Another preferred embodiment of the present invention provides a thickness extensional vibration piezoelectric resonator which is an energy-trapping type thickness extensional vibration piezoelectric resonator having vibration-attenuating portions on both sides of a resonance portion and being arranged to be vibrated in the third harmonic of a thickness extensional vibration mode. The resonator preferably includes a piezoelectric body, and first and second excitation electrodes provided on a pair of major surfaces of the piezoelectric body and opposed to each other with the piezoelectric body disposed therebetween, the first and second excitation electrodes being extended to or near to the side-edges of the piezoelectric body in a direction that is substantially perpendicular to the first direction, the first direction being defined as the direction passing through both of the vibration-attenuating portions located on both sides of the resonance portion, the piezoelectric body having a ratio L/D in a range from about 9.0 to about 14.0 in which L represents the length in the first direction of the piezoelectric body, T is the thickness thereof, and wherein $D=T/3$.

The above described thickness extensional vibration piezoelectric resonator preferably includes the piezoelectric body, and the first and second excitation electrodes provided on both sides of the piezoelectric body. The ratio L/D is preferably within the range of about 9.0 to about 14.0. Accordingly, since the ratio L/D is equal to or less than about 14, and the vibration-attenuating portions are provided on both sides of the resonance portion and not located on both sides of the resonance portion in a direction that is substantially perpendicular to the first direction, the miniaturized thickness extensional vibration piezoelectric resonator is achieved.

In addition, since the ratio L/D is preferably within the range of about 9.0 to about 14.0, spurious components appearing between the resonance and anti-resonance frequencies are effectively minimized by holding the sides along a direction that is substantially perpendicular to the first direction of both end surfaces located in the first direction of the piezoelectric body. As a result, excellent resonance characteristics are achieved.

Further, a piezoelectric resonator which has a very small size, has excellent resonance characteristics, and is operative to utilize the third harmonic in a thickness extensional vibration mode is reliably provided.

In each of the thickness extensional vibration piezoelectric resonators described above, piezoelectric body layers may be located on both sides of the piezoelectric body, that is, on the outsides in the thickness direction of the piezoelectric body. In this case, the first and second electrodes preferably are arranged to define an internal excitation electrode.

According to the above described arrangement, the first and second excitation electrodes define an internal electrode. Moreover, the first and second excitation electrodes can be formed with high precision preferably by using lamination ceramic integration firing technology, which greatly improves the accuracy of the resonance characteristics and increases manufacturing efficiency.

In each of the thickness extensional vibration piezoelectric resonators described above, it is preferred that an elongated strip-shape piezoelectric body is used as the piezoelectric body.

The size in the width direction of each piezoelectric resonator can be reduced when an elongated strip-shaped piezoelectric body is used as the piezoelectric body. As a result, the miniaturization of the thickness extensional vibration piezoelectric resonator is further promoted.

Yet another preferred embodiment of the present invention provides a piezoelectric resonance apparatus that includes first and second casing members arranged to define a case, and the above described thickness extensional vibration piezoelectric resonator bonded to the first casing member so as to provide a space for allowing for free and unhindered vibration of the resonator, the second casing member being secured to the first casing member so as to cover the thickness extensional vibration piezoelectric resonator bonded to the first casing member.

According to the above described arrangement, the piezoelectric resonance device includes one of the above described thickness extensional vibration piezoelectric resonator which is placed in the case defined by the first and second casing members. In addition, the thickness extensional vibration piezoelectric resonator is bonded to the first casing member such that a vibration-permitting space is provided to allow for free and unhindered vibration of the resonator. Therefore, a piezoelectric resonance apparatus including the piezoelectric resonator which minimizes unnecessary spurious components and achieving excellent resonance characteristics is provided.

Preferably, the first casing member includes a capacitor substrate defined by a dielectric substrate and a plurality of electrodes disposed on the dielectric substrate, and the piezoelectric resonator is electrically connected to a capacitor provided in the capacitor substrate.

According to the above described arrangement, a capacitor containing type piezoelectric oscillator including the piezoelectric resonator and the capacitor in combination can be provided.

Other features and advantages of the present invention will become apparent from the following description of the invention which refers to the accompanying drawings.

BRIEF DESCRIPTION OF THE DRAWINGS

FIG. 4 is a graph showing the relationship between the ratio L/D and the intensity (phase value) of the spurious component appearing between the resonance and anti-resonance frequencies in the thickness extensional vibration piezoelectric resonator;

DETAILED DESCRIPTION OF PREFERRED EMBODIMENTS

Figure 1A:
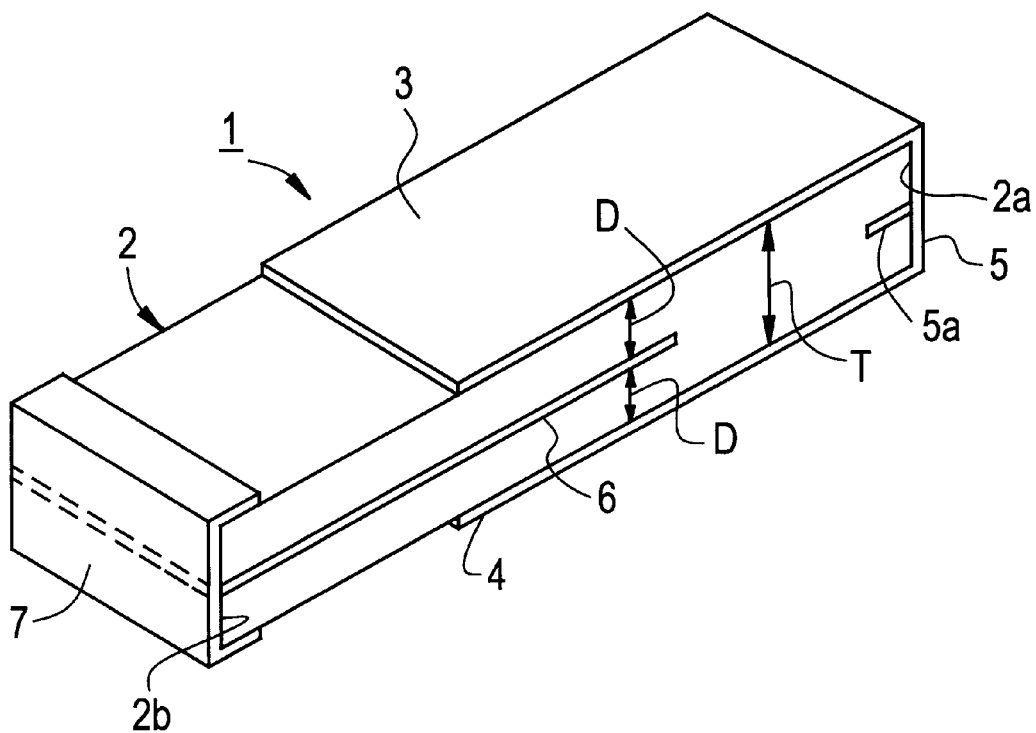
FIG. 1A is a perspective view of a thickness extensional vibration piezoelectric resonator according to a first preferred embodiment of the present invention.
Figure 1B:
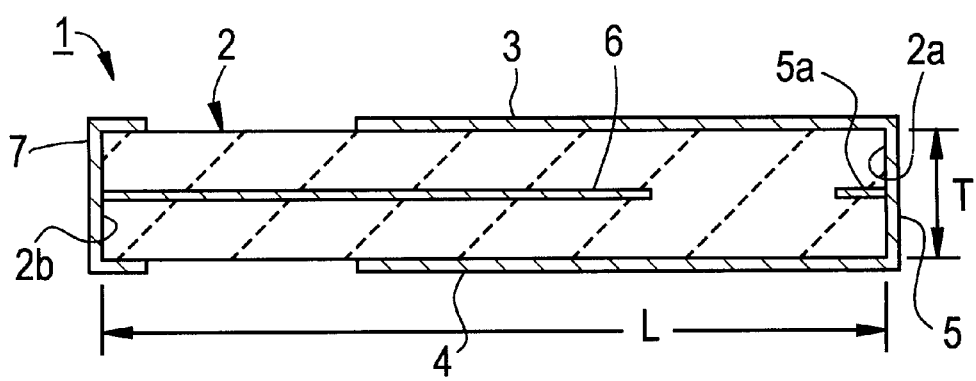
FIG. 1B is a longitudinal section view of a thickness extensional vibration piezoelectric resonator according to a first preferred embodiment of the present invention.

FIGS. 1A and 1B are a perspective view and a longitudinal section view, respectively, of an energy-trapping type thickness extensional vibration piezoelectric resonator according to a first preferred embodiment of the present invention.

The thickness extensional vibration piezoelectric resonator 1 preferably includes an elongated strip-shaped piezoelectric body 2. The piezoelectric body 2 is made of a piezoelectric ceramic such as a lead titanate type ceramic or other suitable material, and is evenly polarized in the thickness direction.

A first excitation electrode 3 is provided on the upper side of the piezoelectric body 2, while a second excitation electrode 4 is provided on the underside thereof. The excitation electrodes 3 and 4 are extended along the upper side and the underside of the piezoelectric body 2 from one of the end surfaces 2a of the piezoelectric body 2 toward the other end surface 2b thereof, respectively.

The excitation electrodes 3 and 4 are connected in common to a terminal electrode 5 disposed on the end surface 2a of the piezoelectric body 2.

Moreover, the terminal electrode 5 has an inward protuberance 5a extending inwardly toward the end surface 2b side, preferably at a middle height of the piezoelectric body 2.

At the middle height of the piezoelectric body 2, an internal electrode 6 is arranged to be opposed to the inward protuberance 5a in the same plane as the inner protuberance 5a. The internal electrode 6 is arranged to extend out to the end surface 2b of the piezoelectric body 2, and electrically connected to a terminal electrode 7 provided on the end surface 2b.

The terminal electrode 7 is extended onto the upper side and the underside of the piezoelectric body 2.

In the thickness extensional vibration piezoelectric resonator of this preferred embodiment, the resonator portion where the first and second excitation electrodes 3 and 4 and the internal electrode 6 are overlapped in the thickness direction, defines a resonance portion. Further, in the piezoelectric body 2, vibration-attenuating portions are defined on both sides in the longitudinal direction of the resonance portion. In other words, on the outside of the resonance portion, the vibration-attenuating portions are provided only in the longitudinal direction, that is, only in the first direction. The first and second excitation electrodes 3, 4 are extended to the side-edges in a direction that is substantially perpendicular to the first direction which is the longitudinal direction, that is, in the width direction of the piezoelectric body 2.

However, the first and second excitation electrodes 3 and 4 may be arranged to extend not all the way to the side-edges in the width direction but near to the side-edges of the piezoelectric body 2. That is, the excitation electrodes 3 and 4 may be arranged so as to not reach the side-edges in the width direction of the piezoelectric body 2, as long as no vibration attenuating portions are provided on the outside of the resonance portion in the width direction of the piezoelectric body 2.

In the thickness extensional vibration piezoelectric resonator of this preferred embodiment, the ratio L/D is preferably in the range of about 9.0 to about 14.0 in which L represents the length in the first direction of the piezoelectric body 2, T represents the thickness of the piezoelectric body 2, and wherein D=T/N, and N represents the order of higher harmonics in a thickness extensional vibration mode to be utilized.

For operation, the second harmonic in a thickness extensional vibration mode is intensely excited by application of an AC voltage between the first and second excitation electrodes 3 and 4 and the internal electrode 6. Thus, the thickness extensional vibration piezoelectric resonator 1 can be operated as a piezoelectric resonator operative to utilize the second harmonic in a thickness extensional vibration mode.

The first and second excitation electrodes 3 and 4, and the internal electrode 6 are arranged so that they are overlapped through the piezoelectric body layers in the approximate center portion in the longitudinal direction of the piezoelectric body 2. Accordingly, an energy-trapping piezoelectric resonator is produced in which the resonator portion where the first and second excitation electrodes 3 and 4 and the internal electrode 6 are overlapped defines the resonance portion, and the piezoelectric body portions located on both sides of the resonance portion in the longitudinal direction define the vibration-attenuating portions.

The first and second excitation electrodes 3 and 4, and the internal electrode 6 are extended over an entire width of the piezoelectric body 2 only in the resonance portion, and do not need to be formed so as to have the same width as the piezoelectric body 2 except for the resonance portion. For example, the excitation electrode 3 is preferably extended along an entire width of the piezoelectric body 2 only in the resonance portion. That is, the excitation electrode 3 portion which is located on the end surface 2a side of the resonance portion may be arranged to have a smaller width, since this excitation electrode 3 portion is used simply for electrical connection of the excitation electrode 3 to the terminal electrode 5.

In the thickness extensional vibration piezoelectric resonator of this preferred embodiment, the vibration attenuating portions are provided on both sides of the resonance portion only in the longitudinal direction of the piezoelectric body 2. No vibration attenuating portion is provided in the width direction of the piezoelectric body 2. Accordingly, the thickness extensional vibration piezoelectric resonator 1 is greatly reduced in the width direction. That is, the miniaturization of the piezoelectric resonator is reliably achieved.

In addition, the thickness extensional vibration piezoelectric resonator of this preferred embodiment has a structure in which the first and second excitation electrodes 3 and 4, and the internal electrode 6 are laminated with the piezoelectric body layers disposed therebetween. Accordingly, the thickness extensional vibration piezoelectric resonator of this preferred embodiment has a higher electric capacity as compared with a conventional thickness extensional vibration piezoelectric resonator 80 having no internal electrode, and eliminates all influence from a floating capacity generated by the circuit board.

Further, the first and second excitation electrodes 3 and 4 are extended to both the side edges in the width direction of the piezoelectric body 2, and thereby, the electric capacity is increased and the influences from a floating capacity generated on the circuit substrate side is greatly inhibited and minimized.

Further, in the thickness extensional vibration piezoelectric resonator 1 of this preferred embodiment, the ratio L/D is preferably within a range of about 9.0 to about 14.0 as described above. Accordingly, unnecessary spurious components are effectively inhibited. This will be described with reference to FIGS. 2 through 4.

The applicants of the present application prepared thickness extensional vibration piezoelectric resonators having different sized. It was observed that at a ratio L/D of up to about 14, a spurious component was generated between the resonance and anti-resonance frequencies. Accordingly, it was determined that the ratio L/D should preferably be at least about 14 in order to suppress the spurious component between the resonance and anti-resonance frequencies.

Then, it was investigated whether the spurious component can be suppressed or not when the ratio L/D has a value up to about 14 in order to achieve further miniaturization.

Figure 2:
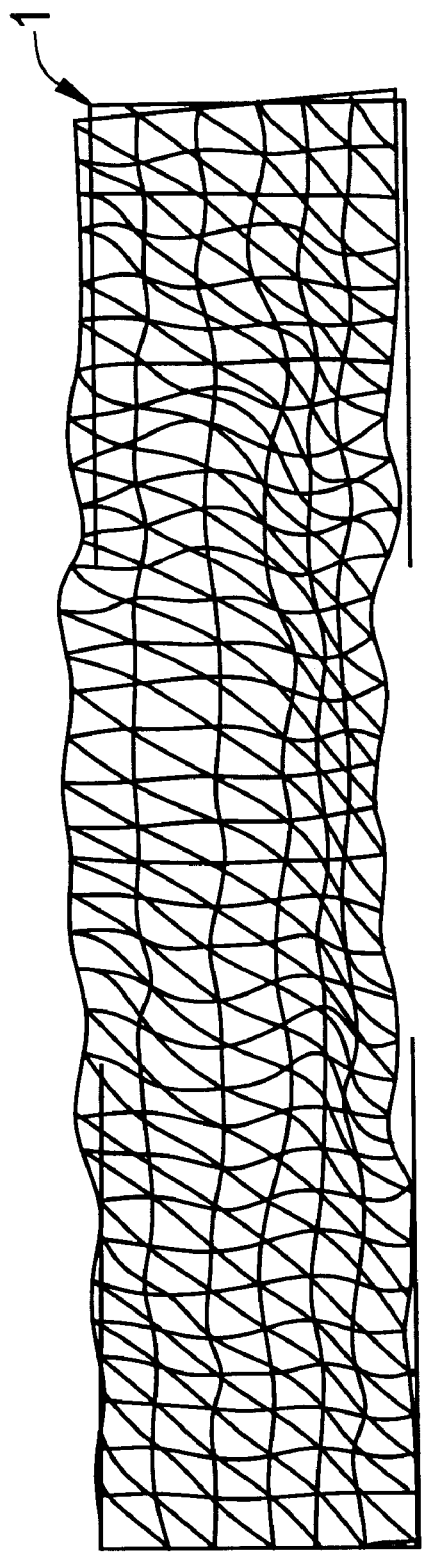
FIG. 2 illustrates the displacement distribution of vibration when the second harmonic in a thickness extensional vibration mode is excited in the thickness extensional vibration piezoelectric resonator.
Figure 3:
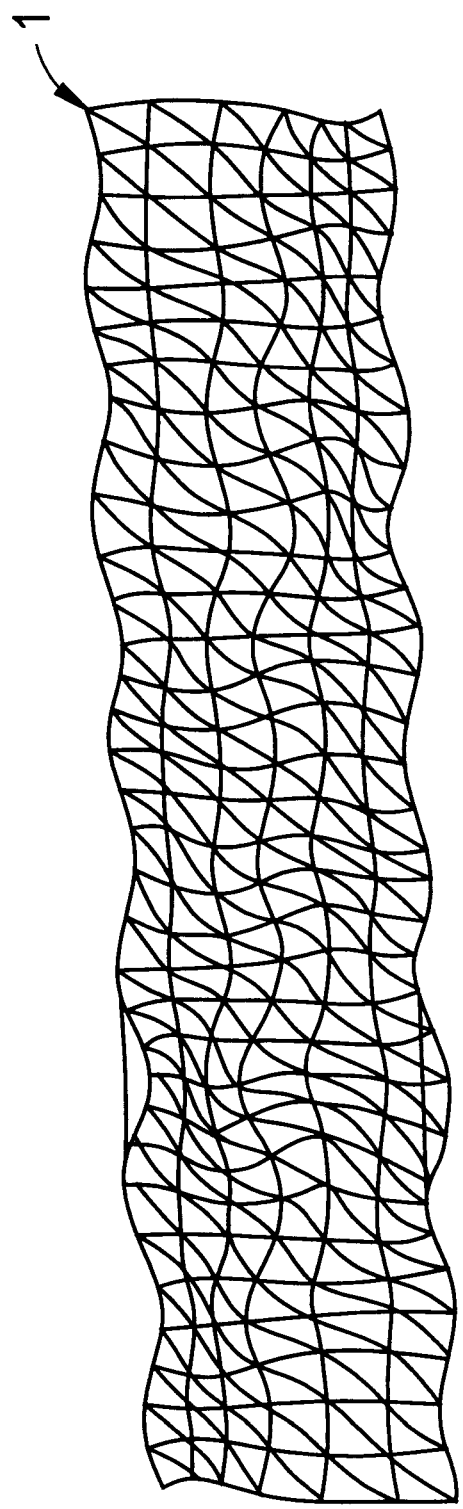
FIG. 3 illustrates the displacement distribution of vibration which causes a spurious component to appear between the resonance and anti-resonance frequencies in the thickness extensional vibration piezoelectric resonator.

Accordingly, the displacement distribution of the thickness extensional vibration piezoelectric resonator was analyzed by the finite element method. FIG. 2 shows the displacement distribution of the thickness extensional vibration with the second harmonic. FIG. 3 shows the displacement distribution of the vibration causing the above-described spurious component. As seen in FIG. 3, the displacement is greatest at both ends of the piezoelectric body 2.

The applicants of the present application discovered that excellent resonance characteristics could be obtained without being significantly affected by the lateral electric field, by holding and fixing at least one of the two sides along a direction that is substantially perpendicular to the thickness extensional vibration direction of each end surface in the longitudinal direction of the piezoelectric body 2 by use of conductive paste or other suitable material or joining methods. The applicants confirmed that this spurious suppressing effect depends on the ratio L/D.

Examples of the thickness extensional vibration piezoelectric resonator 1 were prepared having different ratios of L/D. Of the upper and lower sides of each end surface in the longitudinal direction, that is, in a direction that is substantially perpendicular to the thickness extensional vibration direction, the lower sides were fixed with conductive paste, as described above. The resonance characteristics were measured. Then, the relationship between the intensity of a spurious component of the resonance characteristics and the ratio L/D was measured. FIG. 4 shows the results.

The spurious phase value plotted as the ordinate in FIG. 4 is a minimum phase value of the spurious component appearing between the resonance and resonance frequencies. The solid line B in FIG. 4 represents the characteristics obtained when the lower sides of both of the end surfaces in the first direction of the piezoelectric resonator 1 are fixed as described above. The solid line C represents the characteristics obtained when the piezoelectric resonator 1 is held at inner positions from the end surfaces.

As seen in FIG. 4, when the piezoelectric resonator 1 is held through the lower sides of both of the end surfaces in the longitudinal direction of the piezoelectric resonator 1, and the ratio L/D is less than about 9.0, the spurious component is rapidly enlarged in the range from the boundary line of L/D=9.0. Accordingly, even if the ratio L/D has a value of up to about 14.0, excellent resonance characteristics can be achieved by holding the piezoelectric resonator 1 through the upper sides or the lower sides of both of the end surfaces in the longitudinal direction of the piezoelectric body 2 as described above and setting the ratio L/D at about 9.0 or higher.

Thus, in the thickness extensional vibration piezoelectric resonator 1, if the ratio L/D is about 9.0 to about 14.0, excellent resonance characteristics can be obtained by using the above-described holding method. Accordingly, further miniaturization of the energy-trapping type thickness extensional vibration piezoelectric resonator 1 can be realized.

Figure 5A:
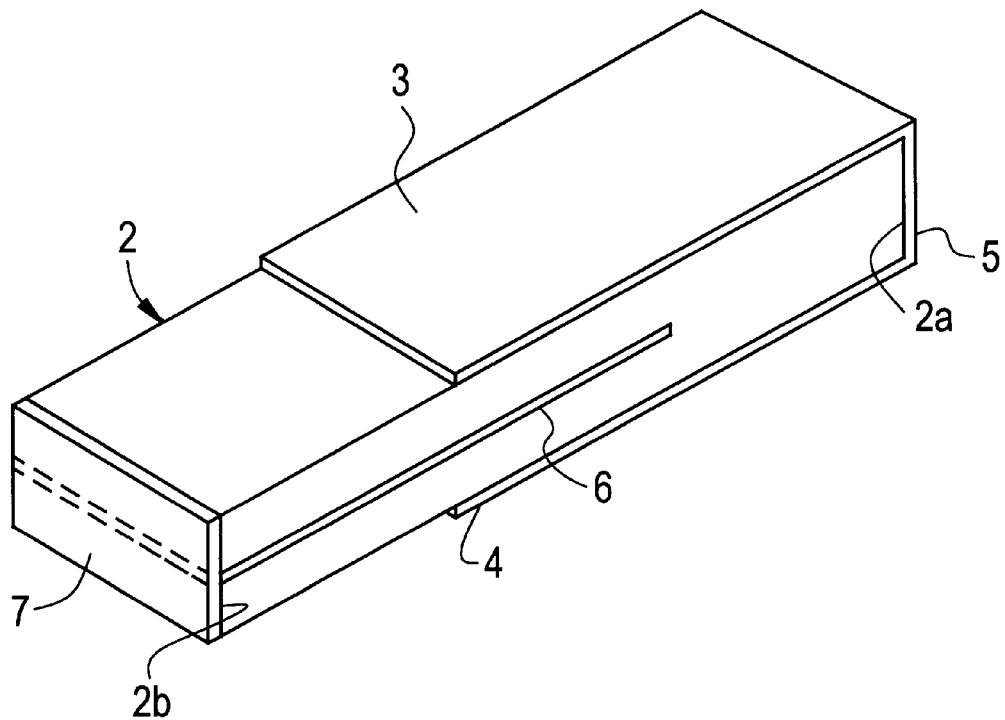
FIG. 5A is a perspective view showing a modification example of the thickness extensional vibration piezoelectric resonator of the first preferred embodiment.
Figure 5B:
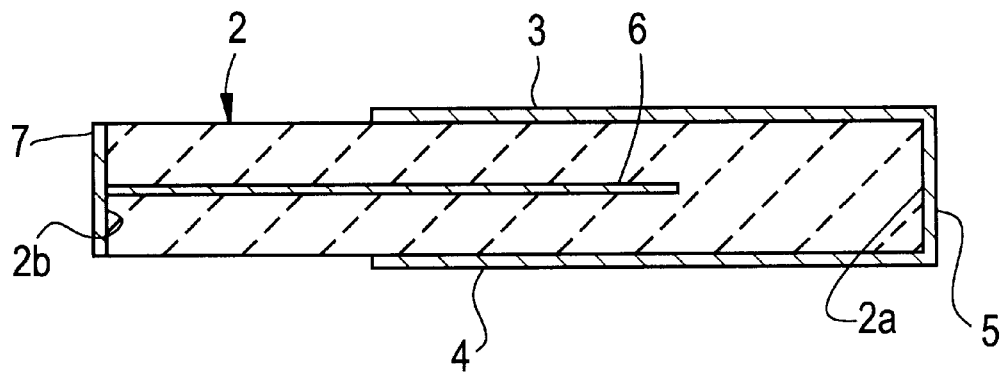
FIG. 5B is a longitudinal section view showing a modification example of the thickness extensional vibration piezoelectric resonator of the first preferred embodiment.

In the thickness extensional vibration piezoelectric resonator 1, the inward protuberance 5a extending toward the internal electrode 6 side is preferably provided on the terminal electrode 5. However, as shown in FIGS. 5A and 5B, the terminal electrode inner protuberance 5a may be eliminated.

Figure 6:
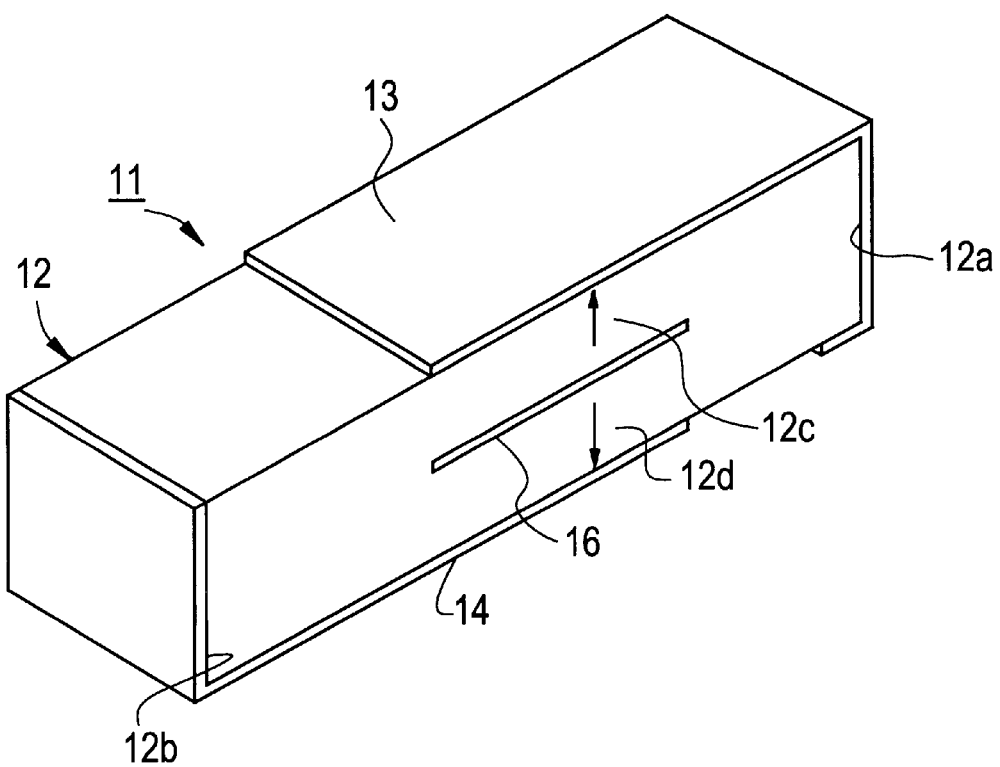
FIG. 6 is a perspective view of a thickness extensional vibration piezoelectric resonator according to a second preferred embodiment of the present invention.

FIG. 6 is a perspective view of a thickness extensional vibration piezoelectric resonator 11 according to a second preferred embodiment of the present invention. In the thickness extensional vibration piezoelectric resonator 11 of the first preferred embodiment, the piezoelectric body 2 is polarized evenly in the thickness direction, and the voltages are applied to the respective layers in the opposite directions, respectively. That is, the two piezoelectric body layers are connected in parallel. However, according to preferred embodiments of the present invention, plural piezoelectric body layers may be a series connection type piezoelectric resonator which is polarized alternately oppositely in the thickness direction.

The thickness extensional vibration piezoelectric resonator 11 of the second preferred embodiment is a series connection type piezoelectric resonator of the above-described type.

The thickness extensional vibration piezoelectric resonator 11 as shown in FIG. 6 includes an elongated, substantially rectangular plate-shaped strip type piezoelectric body 12. A first excitation electrode 13 is disposed on the upper side of the piezoelectric body 12, while a second excitation electrode 14 is provided on the underside thereof. The back side of the first excitation electrode 13 and the front side of the second excitation electrode 14 are opposed to each other with the piezoelectric body 12 disposed therebetween. Further, the excitation electrodes 13 and 14 are opposed to each other in the approximate central portion in the longitudinal direction of the piezoelectric body 12. This portion of the resonator where the first and second excitation electrodes 13 and 14 are opposed to each other constitutes the resonance portion.

In this preferred embodiment, the first and second excitation electrodes 13 and 14 are arranged to extend out to the end surfaces 12a and 12b of the piezoelectric body 12, respectively. The first and second excitation electrodes 13 and 14 may not be extended along an entire width of the piezoelectric body 12, in the area except the resonance portion.

Thus, the excitation electrodes 13 and 14 are extended to both of the side-edges in a direction that is substantially perpendicular to the first direction of the piezoelectric body 12, which is the longitudinal direction. In other words, the excitation electrodes 13 and 14 are extended along an entire width of the piezoelectric body 12.

An internal electrode 16 is provided at the middle height inside of the piezoelectric body 12. The internal electrode 16 is provided in order to polarize the piezoelectric body 12. In particular, for polarization, a relatively high voltage is applied to the internal electrode 16, while a relatively low voltage is applied to the excitation electrodes 13 and 14, so that the piezoelectric layers 12c and 12d are polarized oppositely in the thickness direction, as indicated by the arrows in FIG. 6.

For operation, the second harmonic $TE_2$ in a thickness extensional vibration mode can be excited by applying an AC voltage between the first and second excitation electrodes 13 and 14, that is, without using the internal electrode 16.

Also in the thickness extensional vibration piezoelectric resonator 11 of the second preferred embodiment, the vibration-attenuating portions are not provided on both sides of the resonance portion in the width direction of the piezoelectric body 12, but on both sides of the resonance portion in the longitudinal direction of the piezoelectric body 12. Thus, a miniature thickness extensional vibration piezoelectric resonator is achieved. In addition, the ratio L/D is preferably within the range of about 9.0 to about 14.0, and thereby, the further miniaturization of the piezoelectric resonator 11 is achieved, and unnecessary spurious components between the resonance and anti-resonance frequencies are minimized.

The thickness extensional vibration piezoelectric resonator 11 includes the internal electrode 16, and the excitation electrodes 13 and 14 are extended to both side-edges in the width direction of the piezoelectric body 12, as in the first preferred embodiment. Accordingly, the electric capacity is greatly increased. The thickness extensional vibration piezoelectric resonator 11 is constructed to eliminate the influences of a floating capacity generated on the circuit substrate side.

Figure 7:
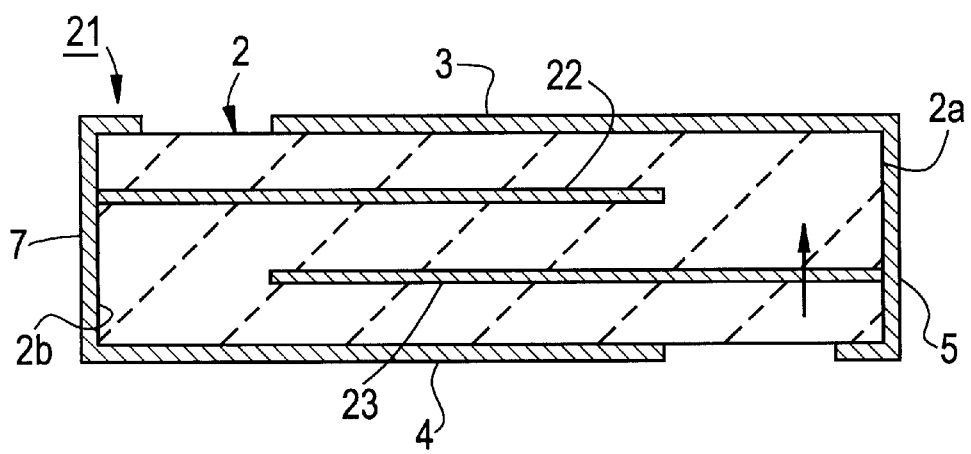
FIG. 7 is a longitudinal section showing a modification example of the thickness extensional vibration piezoelectric resonator according to preferred embodiments of the present invention.
Figure 8:
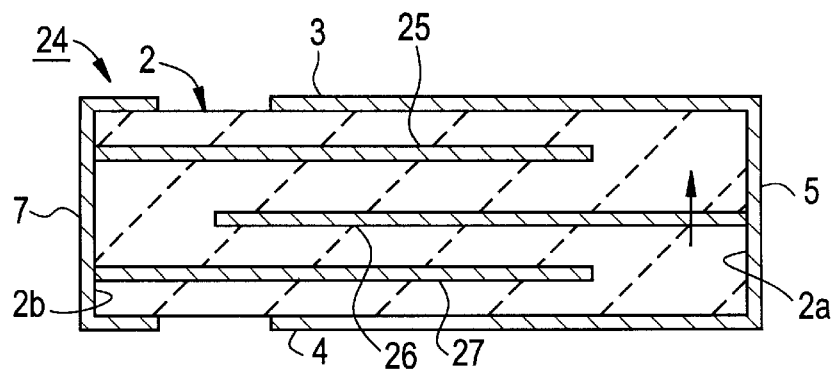
FIG. 8 is a longitudinal section showing a further modification example of the thickness extensional vibration piezoelectric resonator according to preferred embodiments of the present invention.

In the first and second preferred embodiments, the piezoelectric resonators 1 and 11 are operative to utilize the second harmonic in a thickness extensional vibration mode. The piezoelectric resonator according to preferred embodiments of the present invention may utilize higher harmonics except the second harmonic in a thickness extensional vibration mode. FIGS. 7 through 9 are cross-sections illustrating the piezoelectric resonators operative to utilize the other higher harmonics, and are views corresponding to FIG. 2 showing the first preferred embodiment.

FIG. 7 shows a parallel connection type thickness extensional vibration resonator 21 operative to utilize the third harmonic in a thickness extensional vibration mode. In particular, two internal electrodes 22 and 23 are disposed inside of the piezoelectric body 2. The piezoelectric resonator 21 operative to utilize the third harmonic in a thickness extensional vibration mode can be provided by arranging two internal electrodes 22 and 23 inside of the piezoelectric body 2, and polarizing the piezoelectric body 2 evenly in the thickness direction as indicated by the arrow.

A thickness extensional vibration piezoelectric resonator 24 shown in FIG. 8 is a parallel connection type piezoelectric resonator operative to utilize the fourth harmonic in a thickness extensional vibration mode. In the thickness extensional vibration piezoelectric resonator 24, the piezoelectric body 2 is polarized evenly in the thickness direction. Three internal electrodes 25 through 27 are disposed at a substantially equal distance in the thickness direction inside of the piezoelectric body 2, and thereby, the fourth harmonic in a thickness extensional vibration mode can be effectively excited.

Figure 9A:
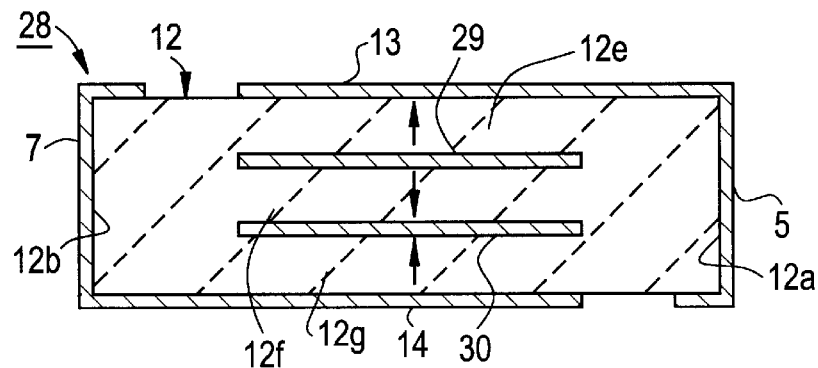
FIG. 9A is a longitudinal section view showing a further modification example of the thickness extensional vibration piezoelectric resonator according to preferred embodiments of the present invention.

FIG. 9A is a cross-section of a series connection type thickness extensional vibration resonator 28 operative to utilize the third harmonic in a thickness extensional vibration mode. In the thickness extensional vibration resonator 28, two internal electrodes 29 and 30 are disposed inside of the piezoelectric body 12, so that the inside of the piezoelectric body 12 is divided into three piezoelectric body layers 12e through 12g. With these internal electrodes 29 and 30, the polarization is performed such that adjacent piezoelectric body layers in the piezoelectric body 12 are polarized oppositely in the thickness direction. Accordingly, the third harmonic in a thickness extensional vibration mode can be excited by applying an AC voltage to the first and second excitation electrodes 13 and 14.

Figure 9B:
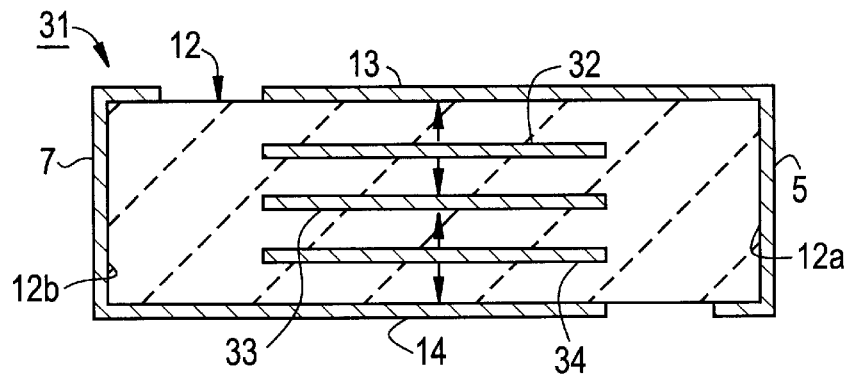
FIG. 9B is a longitudinal section view showing a further modification example of the thickness extensional vibration piezoelectric resonator according to preferred embodiments of the present invention.

Similarly, FIG. 9B is a cross-section of a series connection type thickness extensional vibration piezoelectric resonator 31 operative to utilize the fourth harmonic in a thickness extensional vibration mode. In the piezoelectric body 12, three internal electrodes 32 through 34 are disposed. The piezoelectric body 12 is polarized by use of these internal electrodes 32 through 34, so that adjacent piezoelectric layers in the piezoelectric body 12 are polarized oppositely to each other in the thickness direction, as shown in FIG. 9B.

Accordingly, the series connection type thickness extensional vibration resonator 31 can be operated as a piezoelectric resonator operative to utilize the fourth harmonic in a thickness extensional vibration mode by applying an AC voltage through the first, second excitation electrodes 13 and 14.

In the respective thickness extensional vibration piezoelectric resonators as shown in FIGS. 7 through 10, the vibration attenuating portions are provided on both sides of the resonance portion only in one direction, and in a direction that is substantially perpendicular to the first direction, the first and second excitation electrodes are extended to or near to the side edges of the piezoelectric body. Accordingly, a miniaturized thickness extensional vibration piezoelectric resonator is achieved. Since the thickness extensional vibration piezoelectric resonators preferably includes an internal electrode, the electric capacity is greatly increased, and the resonator is prevented from being affected by influences from a floating capacity generated by a circuit board.

Further, in the respective thickness extensional vibration piezoelectric resonators as shown in FIGS. 7 through 10, since the ratio L/D is preferably within the range of about 9.0 to about 14.0, spurious components appearing between the resonance and anti-resonance frequencies can be effectively suppressed, as in the first preferred embodiment. Thus, excellent resonance characteristics can be achieved.

Figure 10:
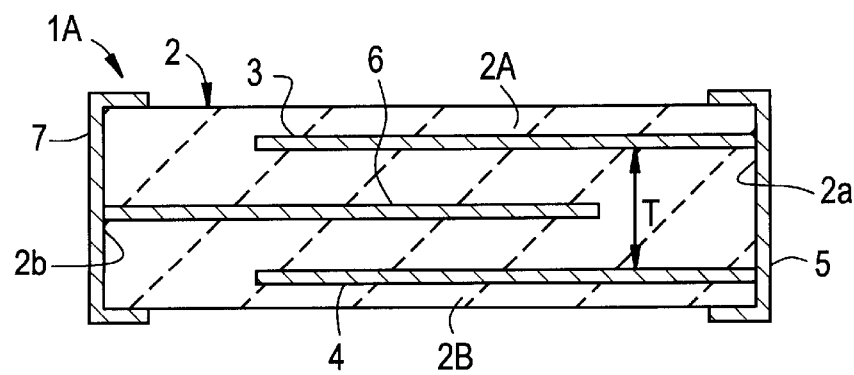
FIG. 10 is a longitudinal section showing another modification example of the thickness extensional vibration piezoelectric resonator according to preferred embodiments of the present invention.

Further, in the thickness extensional vibration piezoelectric resonator of preferred embodiments of the present invention, piezoelectric body layers may be provided on the outsides of the first and second excitation electrodes. In this case, the first and second excitation electrodes are arranged to define internal excitation electrode, respectively. FIG. 10 is a cross-sectional view showing this modification example, which corresponds to the modification example of the thickness extensional vibration piezoelectric resonator 1 of the first preferred embodiment as shown in FIG. 1B.

In the thickness extensional vibration piezoelectric resonator 1A as shown in FIG. 10, the piezoelectric body layers 2A and 2B are provided on the first and second excitation electrodes 3 and 4, respectively. In other words, the first and second excitation electrodes 3 and 4 preferably are arranged to define an internal electrode embedded in the piezoelectric ceramic as well as the internal electrode 6. In other respects, the thickness extensional vibration piezoelectric resonator 1A is the same as the thickness extensional vibration piezoelectric resonator 1 of the first preferred embodiment. Accordingly, the thickness extensional vibration piezoelectric resonator 1A has the same operation/working-effect as the thickness extensional vibration piezoelectric resonator 1 of the first preferred embodiment. In this case, the thickness T of the piezoelectric body is defined as the thickness of the piezoelectric body layer between the excitation electrodes 3 and 4.

The piezoelectric body layers 2A and 2B, when their thicknesses are excessively large, disturb the vibration of the resonance portion. Accordingly, preferably, the piezoelectric body layers 2A and 2B are thin. When the piezoelectric body layers 2A and 2B are thin, the vibration efficiency is greatly improved without the vibration of the resonance portion being disturbed, in some cases.

In the thickness extensional vibration piezoelectric resonator 1A of this modification example, the excitation electrodes 3 and 4 are arranged to define an internal electrode. Accordingly, a piezoelectric body containing the first and second excitation electrodes 3 and 4 and the internal electrode 6 embedded therein can be easily produced by the well-known lamination ceramic integrated firing technology. In addition, the excitation electrodes 3 and 4 can be formed by printing with conductive paste when the lamination ceramic integrated firing technology is used. Therefore, the excitation electrodes 3 and 4 can be formed with high precision, and thereby, the resonance characteristics are greatly improved.

The third preferred embodiment is concerned with a piezoelectric resonance apparatus including a thickness extensional vibration piezoelectric resonator according to other preferred embodiments of the present invention.

Figure 11:
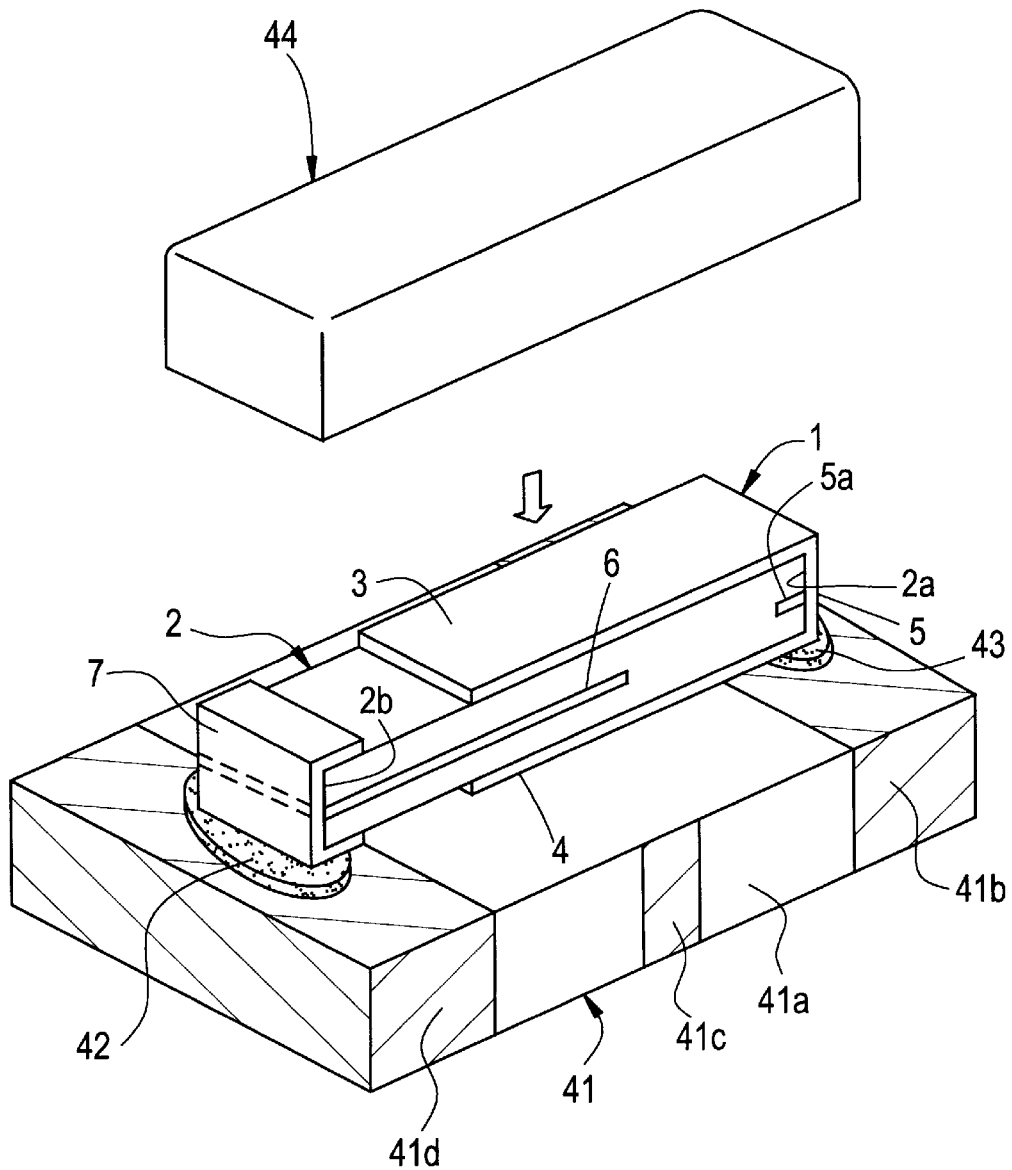
FIG. 11 is an exploded perspective view showing an example of a piezoelectric resonance device according to preferred embodiments of the present invention.

As shown in FIG. 11, in the piezoelectric resonance apparatus of this preferred embodiment, the thickness extensional vibration piezoelectric resonator 1 of the first preferred embodiment is secured to a capacitor substrate 41 defining a first casing member with conductive adhesives 42 and 43.

The capacitor substrate 41 is formed with a dielectric substrate 41a made of a dielectric material such as dielectric ceramics or other suitable material. On the outside of the dielectric substrate 41a, first, second, and third electrodes 41b, 41c, and 41d are arranged to constitute capacitors. The electrodes 41b and 41d are extended on the upper side of the dielectric substrate 41a and also on the side surfaces thereof. The electrodes 41b and 41d are electrically connected to the piezoelectric resonator 1 through the conductive adhesives 42 and 43. In this case, the piezoelectric resonator 1 is secured with the conductive adhesives 42 and 43 so as to define a space between the thickness extensional vibration piezoelectric resonator I and the upper side of dielectric substrate 41a in such a manner to avoid the disturbance of the vibration.

Further, the lower sides of the end surfaces 2a and 2b of the piezoelectric body 2 are bonded to the electrodes 41b and 41d all over the lengths of the lower sides with the conductive adhesives 42 and 43. Accordingly, when the piezoelectric resonator 1 is operated, spurious components appearing between the resonance and anti-resonance frequencies are effectively suppressed.

Figure 12:
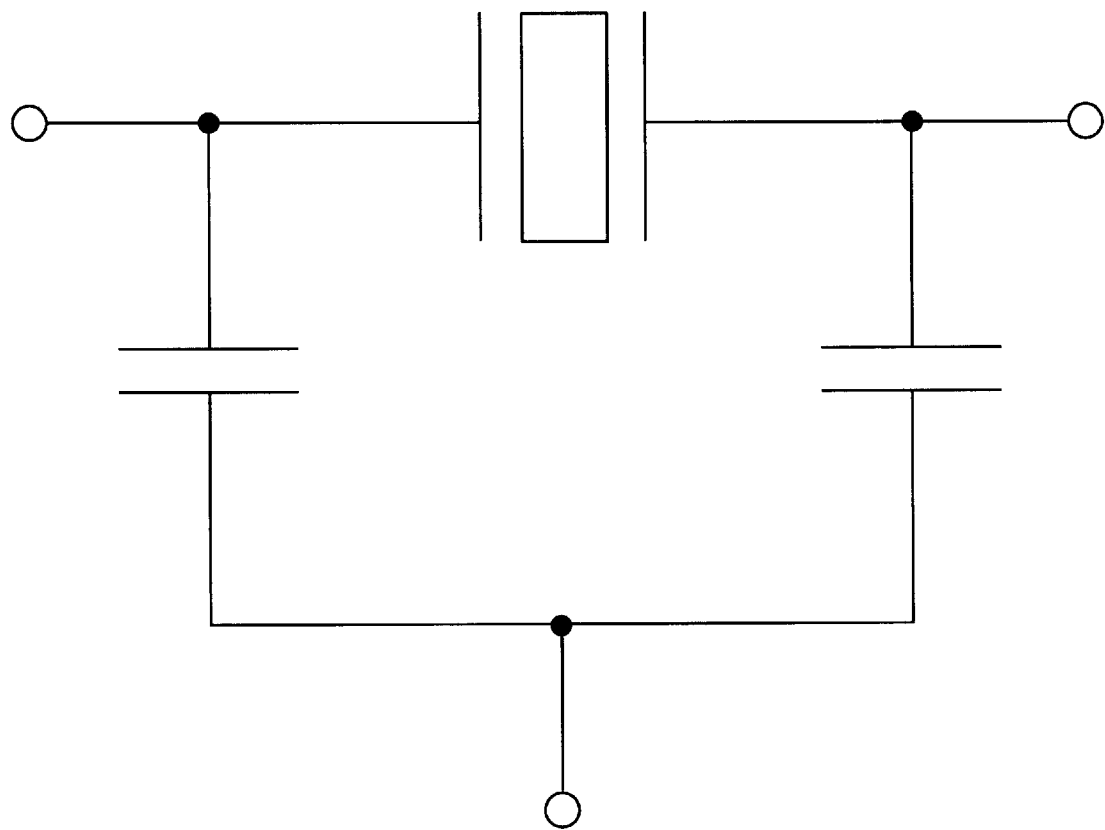
FIG. 12 is a circuit diagram showing a circuit configured with the piezoelectric resonance device as shown in FIG. 11.

The electrode 41c is connected so as to have a ground potential. Accordingly, in the piezoelectric resonance apparatus of this preferred embodiment, the circuit as shown in FIG. 12 is defined between the electrodes 41b, 41c, and 41d. Accordingly, a piezoelectric oscillator including a piezoelectric resonator and the two capacitors in combination is provided.

A cap 44 defining a second casing member is secured to the upper side of the capacitor substrate 41. The cap 44 is secured to the capacitor substrate 41 defining a first casing member so as to cover the piezoelectric resonator 1 by use of an insulating adhesive.

The first and second casing members are not limited to the capacitor substrate 41 and the cap 44. An element such as a housing, cover or casing having a structure suitable for covering the piezoelectric resonator 1 may be used.

For example, the piezoelectric resonance apparatus may be constructed as follows. A substantially rectangular parallelepiped container having an opening in the upper side thereof may be provided as a first casing member. The piezoelectric resonator 1 is placed in the opening of the first casing member, and the opening of the container is closed with a flat lid which defines a second casing member.

Figure 13A:
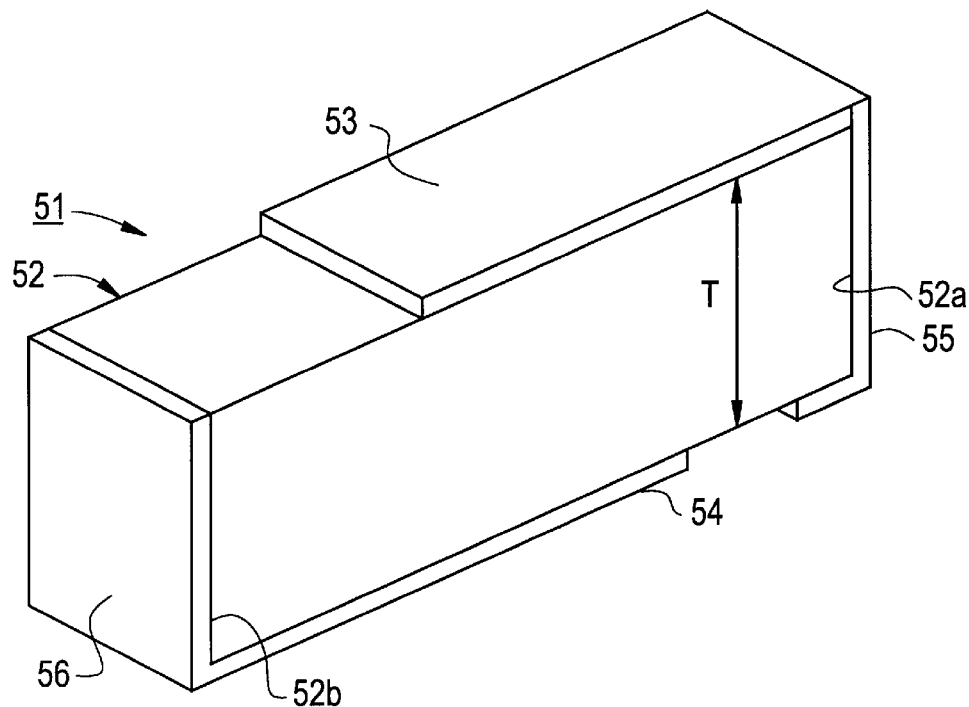
FIG. 13A is a perspective view showing a thickness extensional vibration piezoelectric resonator according to a fourth preferred embodiment of the present invention.
Figure 13B:
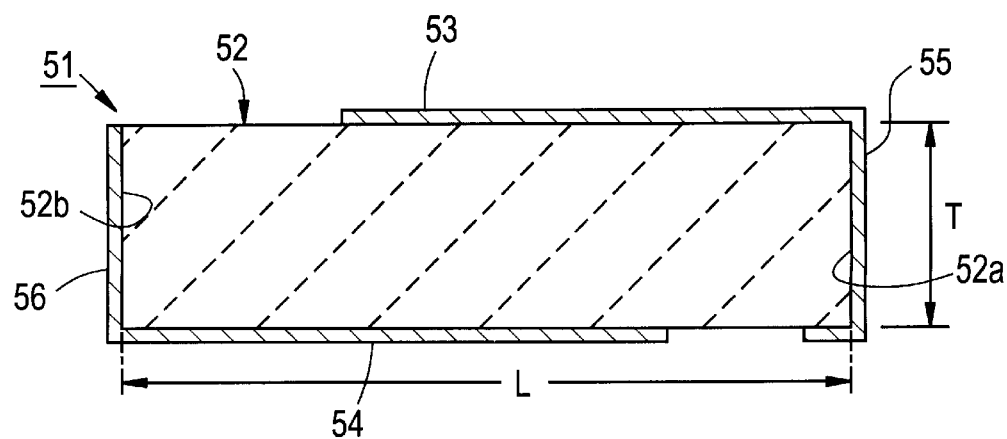
FIG. 13B is a longitudinal section view showing a thickness extensional vibration piezoelectric resonator according to a fourth preferred embodiment of the present invention.

FIGS. 13A and 13B are a perspective view and a longitudinal section view showing a thickness extensional vibration piezoelectric resonator according to a fourth preferred embodiment of the present invention.

The thickness extensional vibration piezoelectric resonator 51 includes an elongated strip-shaped piezoelectric body 52. The piezoelectric body 52 is preferably made of a piezoelectric ceramic such as a lead titanate type ceramic.

The piezoelectric body 52 is polarized evenly in the thickness direction. A first excitation electrode 53 is provided on the upper side of the piezoelectric body 52, while a second excitation electrode 54 is provided on the underside thereof.

The excitation electrode 53 extends on the upper side of the piezoelectric body 52 from one 52a of the end surfaces of the piezoelectric body 52 toward the other end surface 52b, preferably without reaching the end surface 52b. The excitation electrode 54 is extended on the underside of the piezoelectric body 52 from one end surface 52b toward the other end surface 52a, preferably without reaching the end surface 52a.

Thus, the back side of the excitation electrode 53 and the front side of the excitation electrode 54 are opposed to each other through the piezoelectric body 52 in a central portion along the longitudinal direction of the piezoelectric body 52.

The excitation electrode 53 is connected to the terminal electrode 55 which is extended on the end surface 52a and also onto the underside of the piezoelectric body 52.

In operation, the third harmonic in a thickness extensional vibration mode is intensively excited by applying an AC voltage between the first and second excitation electrodes 53 and 54. Thus, the thickness extensional vibration piezoelectric resonator 51 can be operated as a piezoelectric resonator operative to utilize the third harmonic.

In this preferred embodiment, the first and second electrodes 53 and 54 are overlapped in the central portion along the longitudinal direction of the piezoelectric body 52, with the piezoelectric layer disposed therebetween. Accordingly, the resonator portion where the first and second excitation electrodes 53 and 54 are overlapped defines an energy-trapping type resonance portion. The energy for the vibration of the resonance portion is attenuated in the piezoelectric body portions which are located between the resonance portion and the end surfaces 52a and 52b.

In other words, on both sides of the resonance portion, the vibration attenuating portions are provided only in the longitudinal direction (first direction) of the piezoelectric body 52. The first and second excitation electrodes are extended to the side edges of the piezoelectric plate in a direction that is substantially perpendicular to the longitudinal direction, and thus, the first and second excitation electrodes extend to the side-edges and are elongated in the longitudinal direction.

In this case, the first and second excitation electrodes 53 and 54 need to be extended over an entire width of the piezoelectric body 52 only in the resonance portion. It is not necessary that the first and second excitation electrodes 53 and 54 be arranged so as to have the same width areas except for the resonance portion. For example, the excitation electrode 53 is only required to extend over an entire width of the piezoelectric body 52 only in the resonance portion. The excitation electrode 53 portion which is on the end surface 52a side of the resonance portion may be constructed to have a smaller width, since it is used only for electrical connection of the excitation electrode to the terminal electrode 5.

In the thickness extensional vibration piezoelectric resonator 51 of this preferred embodiment, the ratio L/D is preferably within the range of about 9.0 to about 14.0, in which D=T/3, where T is the thickness of the piezoelectric body, and L is the length in the longitudinal direction (first direction) of the piezoelectric body 52. That is, since the ratio L/D is preferably with the desired range, as in the first preferred embodiment, unnecessary spurious components appearing between the resonance and anti-resonance frequencies are minimized. This will be described with reference to FIGS. 14 through 16.

Figure 14:
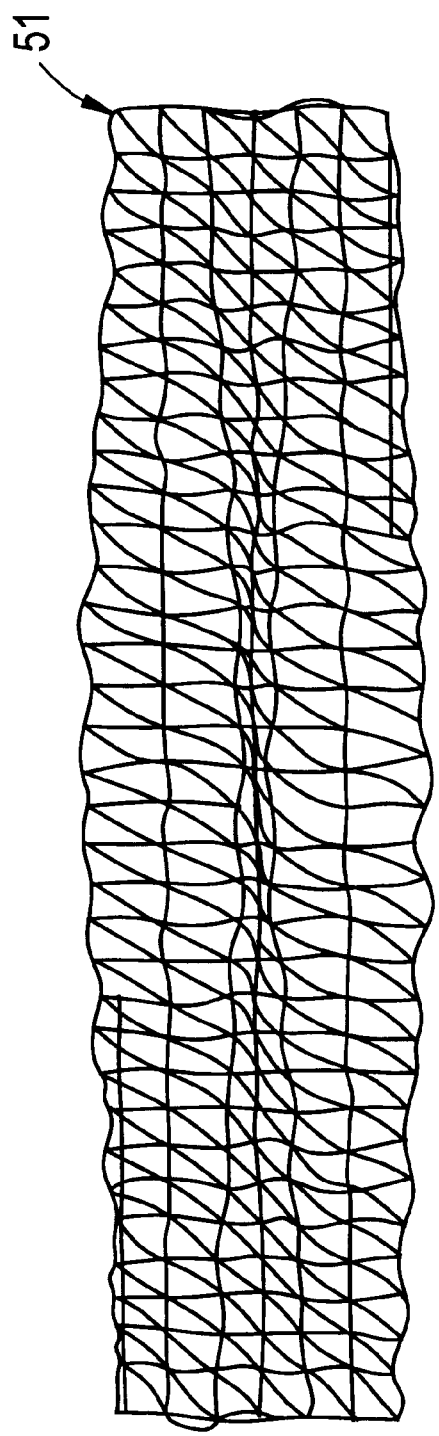
FIG. 14 illustrates the displacement distribution when the third harmonic in a thickness extensional vibration mode is excited in the thickness extensional vibration piezoelectric resonator of the fourth preferred embodiment.
Figure 15:
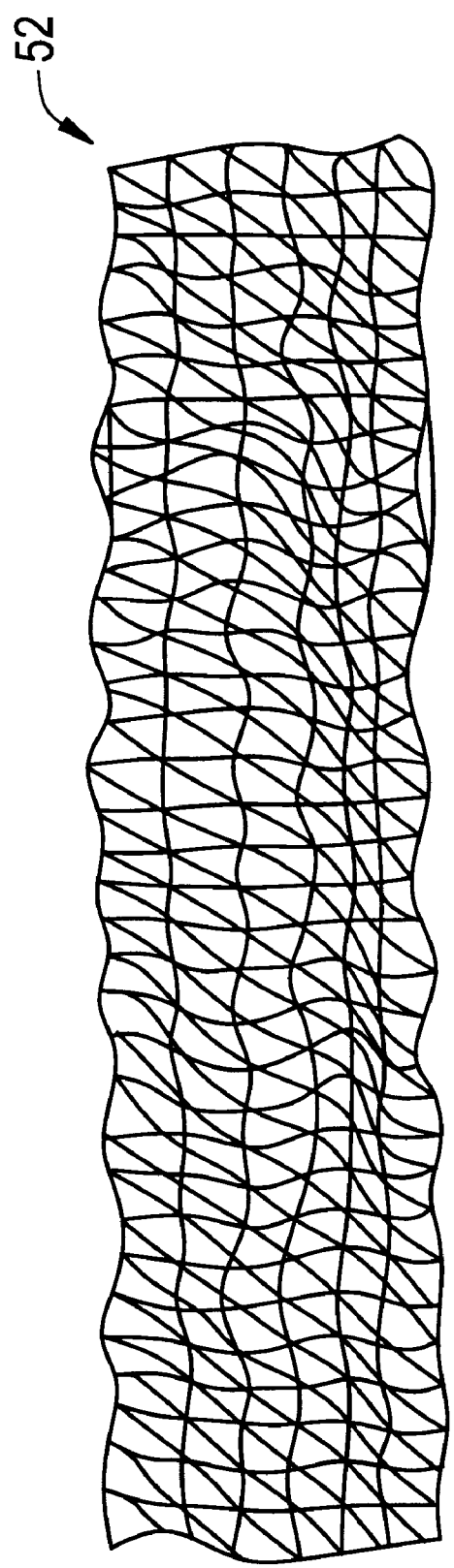
FIG. 15 illustrates the displacement distribution when spurious vibration between the resonance and anti-resonance frequencies is caused in the thickness extensional vibration piezoelectric resonator of the fourth preferred embodiment.

Thus, using the finite element method, the displacement distribution of the spurious vibration appearing between the resonance and anti-resonance frequencies when the thickness extensional vibration piezoelectric resonator 51 was excited with the third harmonic in a thickness extensional vibration mode, was analyzed. FIGS. 14 and 15 show the results of this analysis. As seen in FIG. 15, when the spurious vibration occurs, the displacement becomes large at both ends in the longitudinal direction of the piezoelectric body 52.

The applicants discovered that the spurious component could be minimized by holding both of the ends in the longitudinal direction of the piezoelectric body 52. In particular, the applicants discovered that the spurious component could be suppressed by holding the two sides in a direction that is substantially perpendicular to the thickness extensional vibration direction of the sides of the end surfaces 52a and 52b of the piezoelectric body 52, namely, by holding the upper or lower sides of the end surfaces 52a and 52b.

Figure 16:
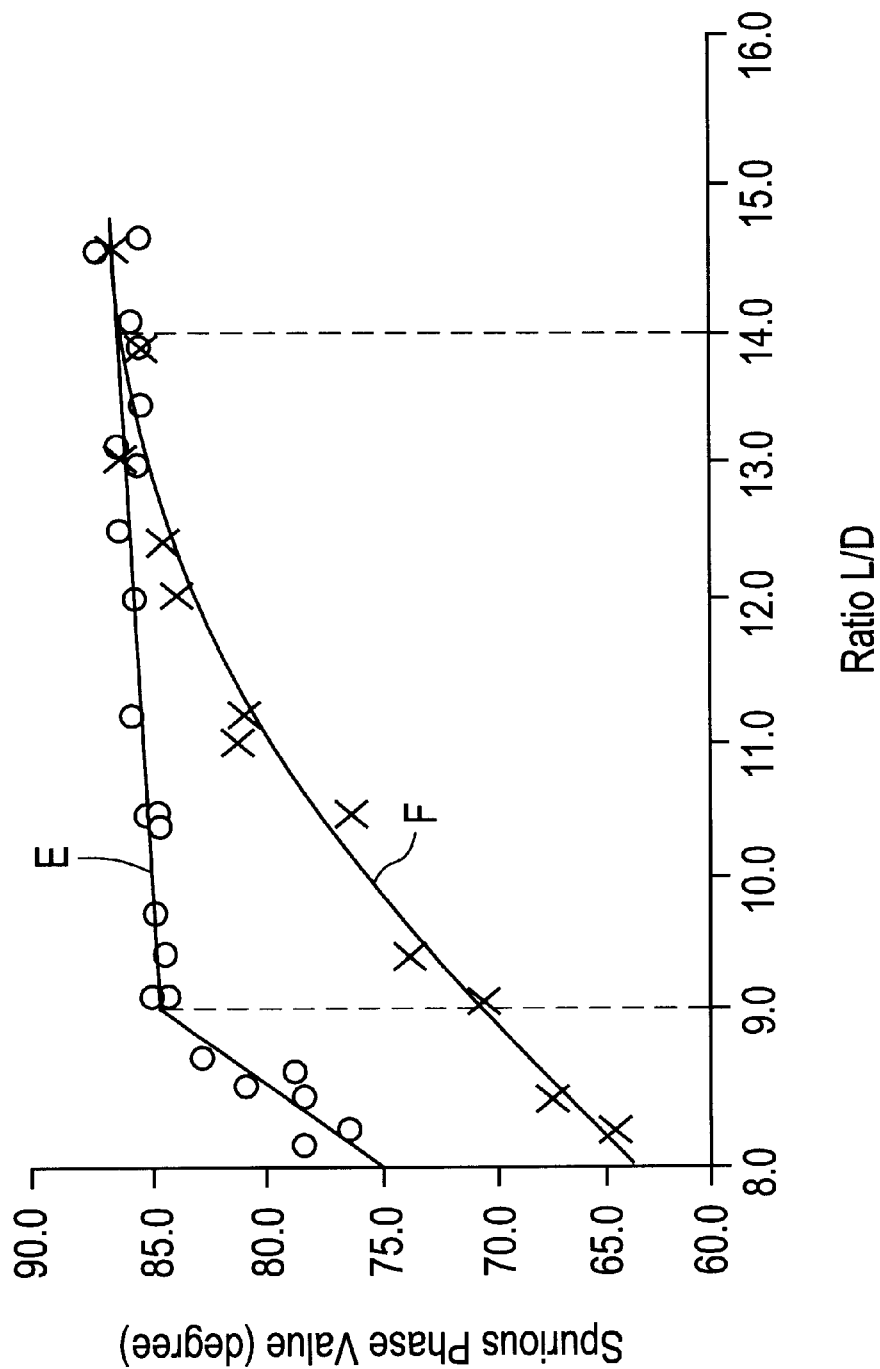
FIG. 16 is a graph showing the relationship between the ratio L/D of the thickness extensional vibration piezoelectric resonator of the fourth preferred embodiment and a spurious component (expressed by a phase value) appearing between the resonance and anti-resonance frequencies.

The thickness extensional vibration piezoelectric resonator 51 of which the ratio L/D was varied was held in the manner as described above, and the spurious generation was investigated. FIG. 16 shows the results. In FIG. 16, the intensity of the spurious component appearing between the resonance and anti-resonance frequencies is plotted as the ordinate. The plotted values are minimum phase values in the generated spurious components.

The solid line E in FIG. 16 represents the results obtained when the thickness extensional vibration piezoelectric resonator of this preferred embodiment was held as described above. The solid line F represents the results obtained when the thickness extensional vibration piezoelectric resonator 51 was held not by the lower sides of the end surfaces 52a and 52b but on the inner side of the lower sides.

As seen in comparison of the solid lines E and F, when the thickness extensional vibration piezoelectric resonator 51 of this preferred embodiment is held by the lower sides of the end surfaces 52a and 52b, spurious components are minimized at a ratio L/D of at least about 9.0.

That is, it is understood that miniaturization of the apparatus can be realized, and also, excellent resonance characteristics can be attained by setting the ratio L/D within the range of about 9.0 to about 14.0, and holding the thickness extensional vibration piezoelectric resonator 51 via the two sides, namely, the upper sides or the lower sides of the end surfaces 52a and 52b, arranged substantially perpendicular to the thickness extensional vibration direction.

In the thickness extensional vibration piezoelectric resonator 51, the ratio L/D is preferably within the range from about 9.0 to about 14.0.

In addition, in the thickness extensional vibration piezoelectric resonator 51, the excitation electrodes 53 and 54 may take the form of an internal excitation electrode by providing piezoelectric body layers on the upper side and the underside of the piezoelectric body 52, respectively. This modification example is shown in FIG. 17.

Figure 17:
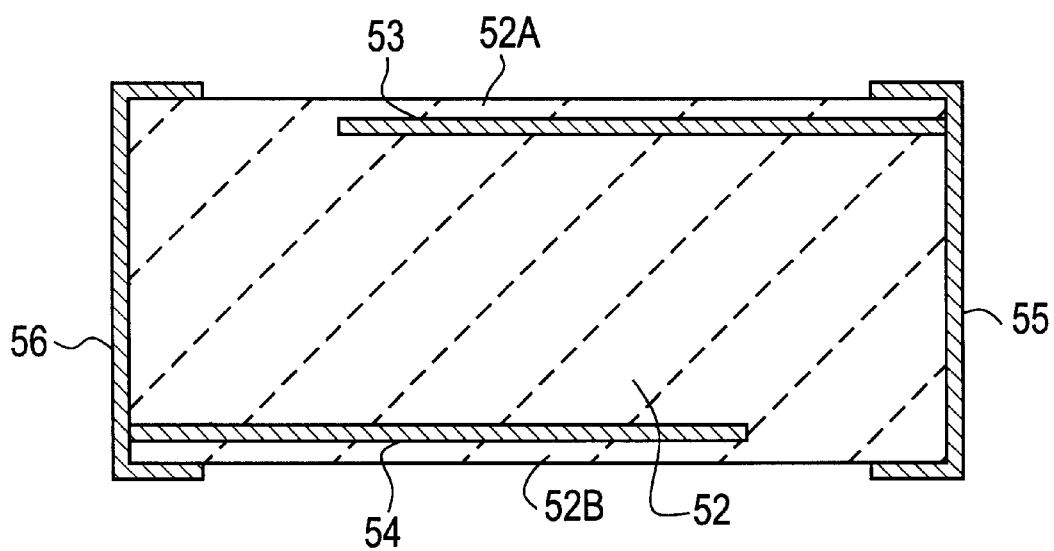
FIG. 17 is a cross-section showing a modification example of the thickness extensional vibration piezoelectric resonator of the fourth preferred embodiment.

In the modification example of FIG. 17, the piezoelectric body layers 52A and 52B are arranged on both sides in the thickness direction of the piezoelectric body 52, and thereby, the excitation electrodes 53 and 54 function as an internal excitation electrode. In this case, the thickness T of the piezoelectric body is defined as the thickness of the piezoelectric body layer between the excitation electrodes 53 and 54.

Figure 18:
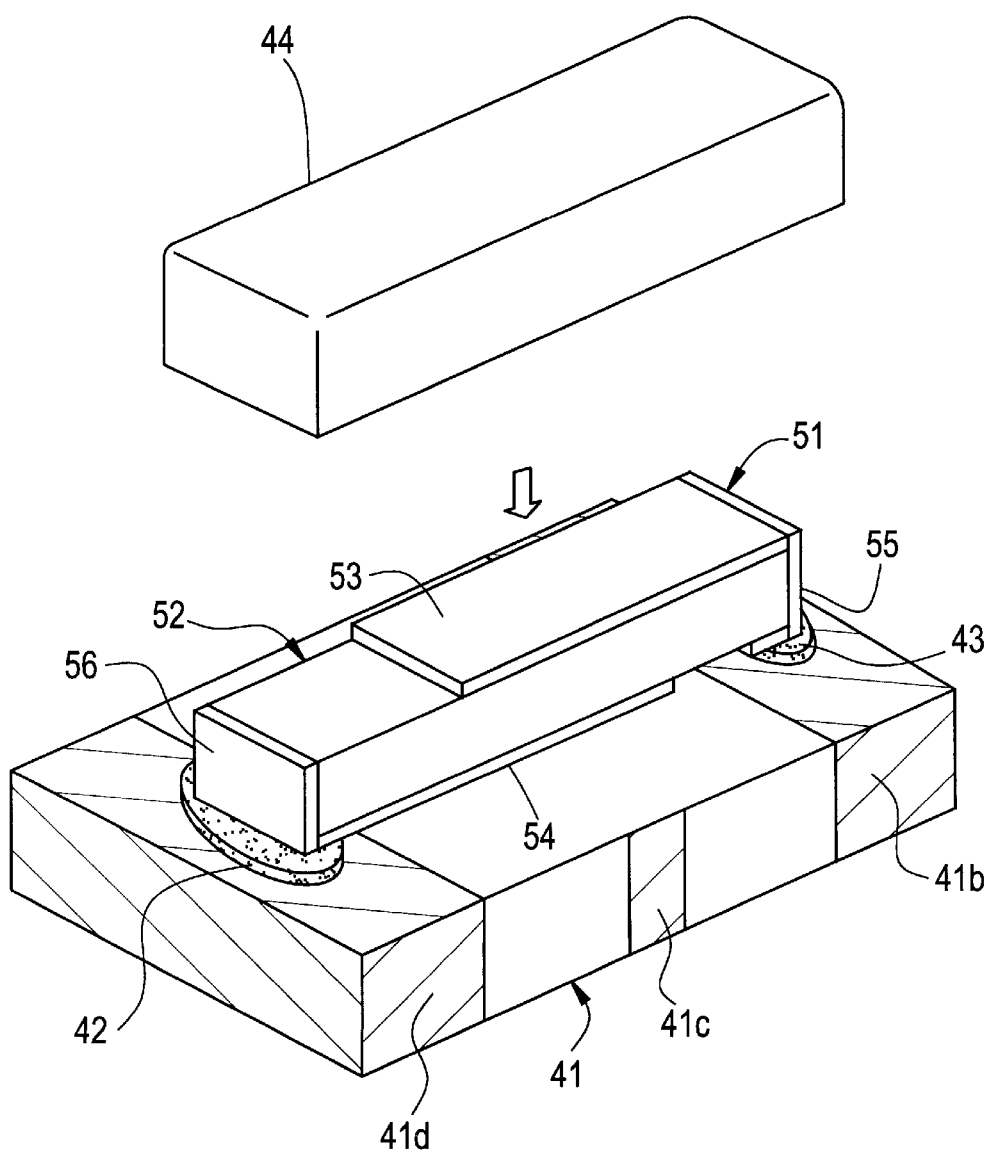
FIG. 18 is an exploded perspective view showing a piezoelectric resonance device including the thickness extensional vibration piezoelectric resonator of the fourth preferred embodiment.
Figure 19:
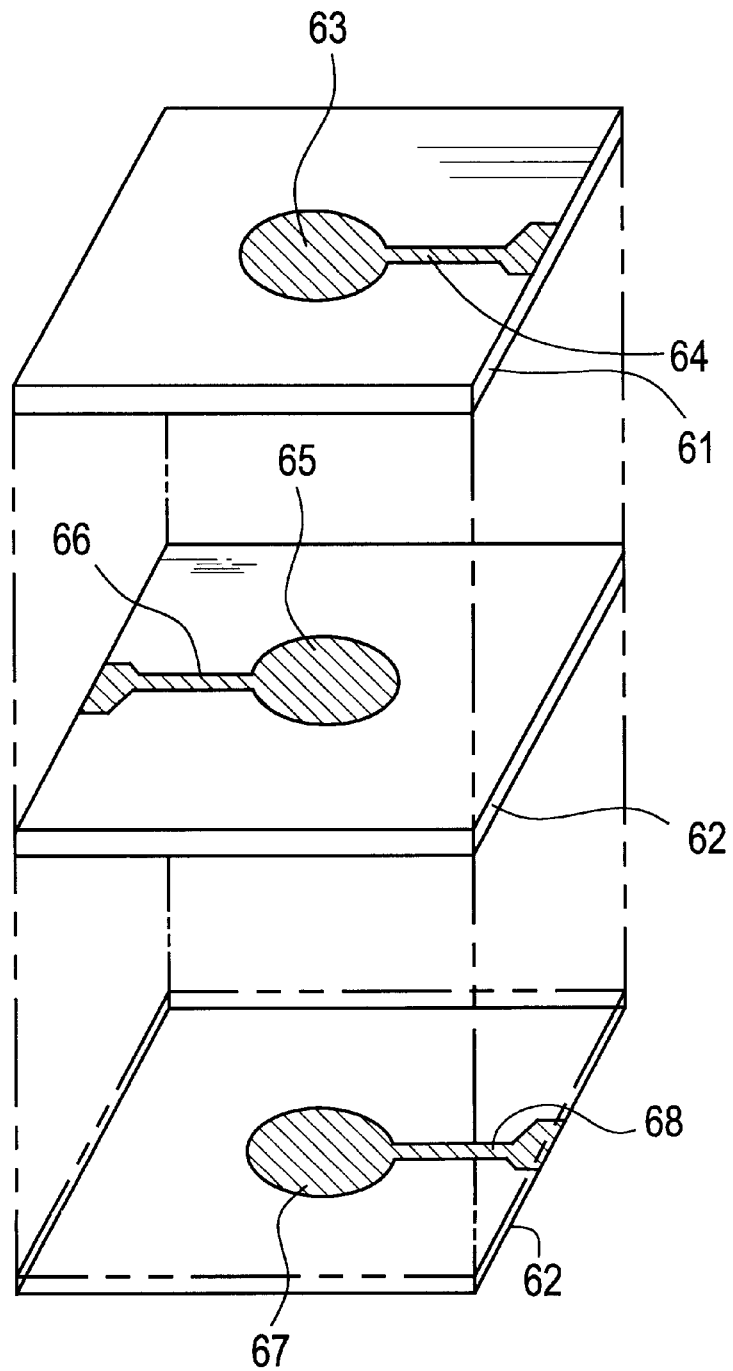
FIG. 19 is an exploded perspective view illustrating one example of prior art thickness extensional vibration piezoelectric resonators.
Figure 20:
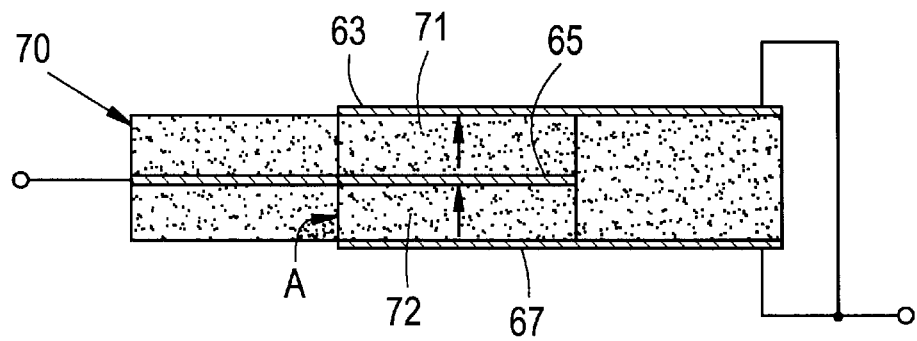
FIG. 20 is a cross-section of the thickness extensional vibration piezoelectric resonator as shown in FIG. 19.
Figure 21:
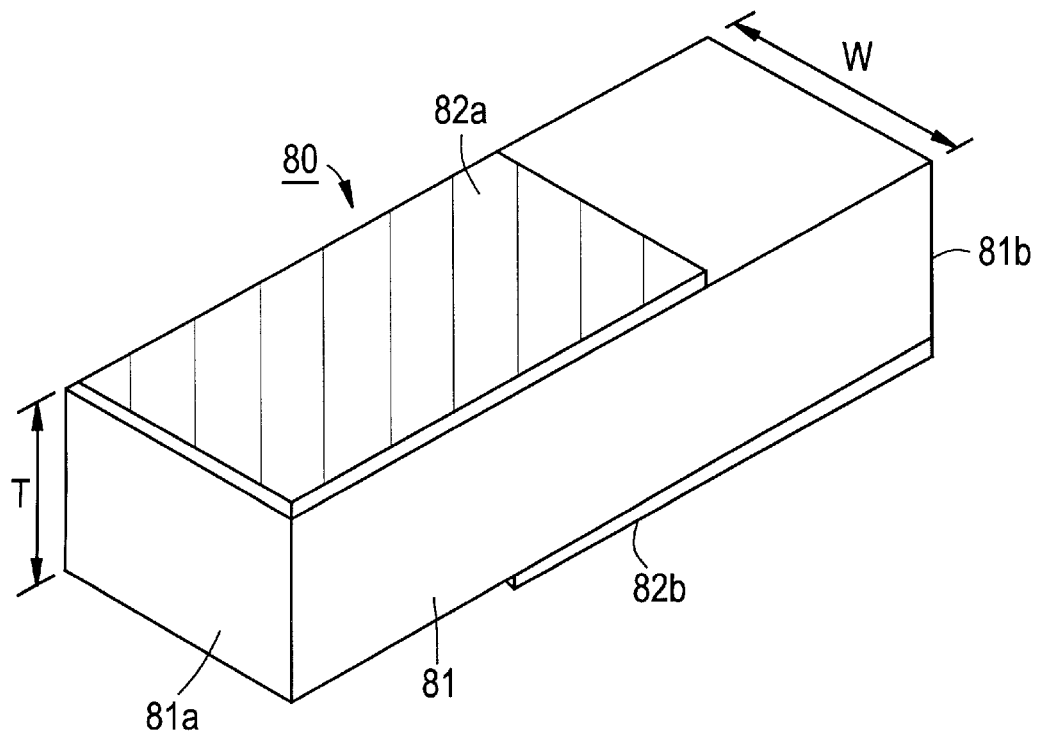
FIG. 21 is a perspective view of another example of the conventional thickness extensional vibration piezoelectric resonator.

Further, the thickness extensional vibration piezoelectric resonator 51 may be placed in a case defined by the first and second casing members to provide a piezoelectric resonance apparatus, as in the thickness extensional vibration piezoelectric resonator 1 of the first preferred embodiment. That is, as shown in FIG. 18, the piezoelectric resonance apparatus can be formed by using the thickness extensional vibration piezoelectric resonator 51 instead of the thickness extensional vibration piezoelectric resonator 1 in the piezoelectric resonance apparatus as shown in FIG. 11.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator, comprising:

a piezoelectric body including a plurality of piezoelectric layers and a plurality of side edges;

first and second excitation electrodes disposed on both sides of the piezoelectric body and being opposed to each other with the piezoelectric body disposed therebetween;

at least one layer defining an internal electrode inside of the piezoelectric body and arranged to at least partially oppose the first and second excitation electrodes with the piezoelectric layers disposed therebetween;

a resonance portion;

a pair of vibration-attenuating portions disposed on opposite sides of the resonance portion; wherein said resonance portion is defined by a portion of the piezoelectric body where the first and second excitation electrodes and the internal electrode are overlapped in a thickness direction thereof, said first and second excitation electrodes being arranged to extend to or near to the side edges of the piezoelectric body in a direction that is substantially perpendicular to a first direction which is a direction passing through both of the pair of vibration-attenuating portions located on both sides of the resonance portion; and said piezoelectric body having a ratio L/D within a range of about 9.0 to about 14.0 in which L represents the length in the first direction of the piezoelectric body, T represents the thickness of the piezoelectric body, and D=T/N, where N represents an order of higher harmonics in a thickness extensional vibration mode.

2. The piezoelectric resonator according to claim 1, wherein the piezoelectric resonator is constructed to be vibrated using N-order higher harmonics in a thickness extensional vibration mode.

3. The piezoelectric resonator according to claim 1, wherein the piezoelectric body has a substantially rectangular plate shape.

4. The piezoelectric resonator according to claim 1, wherein at least two of the plurality of piezoelectric layers are disposed on exterior surfaces of the piezoelectric body so as to cover the first and second excitation electrodes, the first and second electrodes being arranged to define internal excitation electrodes.

5. The piezoelectric resonator according to claim 1, wherein the piezoelectric body includes an elongated strip-shaped piezoelectric body.

6. The piezoelectric resonator according to claim 1, wherein the piezoelectric resonator is an energy-trap type resonator.

7. The piezoelectric resonator comprising:

a piezoelectric body including a plurality of piezoelectric layers and a plurality of side edges;

first and second excitation electrodes disposed on both sides of the piezoelectric body and being opposed to each other with the piezoelectric body disposed therebetween;

at least one layer defining an internal electrode inside of the piezoelectric body and arranged to at least partially oppose the first and second excitation electrodes with the piezoelectric layers disposed therebetween;

a resonance portion;

a pair of vibration-attenuating portions disposed on opposite sides of the resonance portion; wherein said resonance portion is defined by a portion of the piezoelectric body where the first and second excitation electrodes and the internal electrode are overlapped in a thickness direction thereof, said first and second excitation electrodes being arranged to extend to or near to the side edges of the piezoelectric body in a direction that is substantially perpendicular to a first direction which is a direction passing through both of the pair of vibration-attenuating portions located on both sides of the resonance portion; and said piezoelectric body is arranged to have a ratio L/D within the range of about 9.0 to about 14.0 in which L represents the length in the first direction of the piezoelectric body, T represents the thickness thereof, and $D=T/3$.

8. The piezoelectric resonator according to claim 7, wherein the piezoelectric resonator is constructed vibrate in the third harmonic in a thickness extensional vibration mode.

9. The piezoelectric resonator according to claim 7, wherein the piezoelectric body has a substantially rectangular plate shape.

10. The piezoelectric resonator according to claim 7, wherein at least two of the plurality of piezoelectric layers are disposed on exterior surfaces of the piezoelectric body so as to cover the first and second excitation electrodes, the first and second electrodes being arranged to define internal excitation electrodes.

11. The piezoelectric resonator according to claim 7, wherein the piezoelectric body includes an elongated strip-shaped piezoelectric body.

12. The piezoelectric resonator according to claim 7, wherein the piezoelectric resonator is an energy-trap type resonator.

13. A piezoelectric resonance apparatus comprising first and second casing members arranged to define a case;

a piezoelectric resonator bonded to the first casing member so as to define a space allowing for free vibration of the piezoelectric resonator, the piezoelectric resonator including:

a piezoelectric body including a plurality of piezoelectric layers and a plurality of side edges;

first and second excitation electrodes disposed on both sides of the piezoelectric body and being opposed to each other with the piezoelectric body disposed therebetween;

at least one layer defining an internal electrode inside of the piezoelectric body and arranged to at least partially oppose the first and second excitation electrodes with the piezoelectric layers disposed therebetween;

a resonance portion;

a pair of vibration-attenuating portions disposed on opposite sides of the resonance portion; wherein said resonance portion is defined by a portion of the piezoelectric body where the first and second excitation electrodes and the internal electrode are overlapped in a thickness direction thereof, said first and second excitation electrodes being arranged to extend to or near to the side edges of the piezoelectric body in a direction that is substantially perpendicular to a first direction which is a direction passing through both of the pair of vibration-attenuating portions located on both sides of the resonance portion; and said piezoelectric body having a ratio L/D within a range of about 9.0 to about 14.0 in which L represents the length in the first direction of the piezoelectric body, T represents the thickness of the piezoelectric body, and $D=T/N$, where N represents an order of higher harmonics in a thickness extensional vibration mode; wherein the second casing member is secured to the first casing member so as to cover the piezoelectric resonator bonded to the first casing member.

14. A piezoelectric resonance apparatus according to claim 13, wherein the first casing member comprises a capacitor substrate including a capacitor disposed therein, a dielectric substrate and a plurality of electrodes disposed on the dielectric substrate, the piezoelectric resonator is electrically connected to the capacitor disposed in the capacitor substrate.

15. The piezoelectric resonance apparatus according to claim 13, wherein the piezoelectric resonator is constructed to be vibrated using N-order higher harmonics in a thickness extensional vibration mode.

16. The piezoelectric resonance apparatus according to claim 13, wherein the piezoelectric body has a substantially rectangular plate shape.

17. The piezoelectric resonance apparatus according to claim 13, wherein at least two of the plurality of piezoelectric layers are disposed on exterior surfaces of the piezoelectric body so as to cover the first and second excitation electrodes, the first and second electrodes being arranged to define internal excitation electrodes.

18. The piezoelectric resonance apparatus according to claim 13, wherein the piezoelectric body includes an elongated strip-shaped piezoelectric body.

19. The piezoelectric resonance apparatus according to claim 13, wherein the piezoelectric resonator is an energy-trap type resonator.

20. A piezoelectric resonance apparatus comprising first and second casing members arranged to define a case;

a piezoelectric resonator bonded to the first casing member so as to define a space allowing for free vibration of the piezoelectric resonator, the piezoelectric resonator including:

a piezoelectric body including a plurality of piezoelectric layers and a plurality of side edges;

first and second excitation electrodes disposed on both sides of the piezoelectric body and being opposed to each other with the piezoelectric body disposed therebetween;

at least one layer defining an internal electrode inside of the piezoelectric body and arranged to at least partially oppose the first and second excitation electrodes with the piezoelectric layers disposed therebetween;

a resonance portion;

a pair of vibration-attenuating portions disposed on opposite sides of the resonance portion; wherein said resonance portion is defined by a portion of the piezoelectric body where the first and second excitation electrodes and the internal electrode are overlapped in a thickness direction thereof, said first and second excitation electrodes being arranged to extend to or near to the side edges of the piezoelectric body in a direction that is substantially perpendicular to a first direction which is a direction passing through both of the pair of vibration-attenuating portions located on both sides of the resonance portion; and said piezoelectric body is arranged to have a ratio L/D within the range of about 9.0 to about 14.0 in which L represents the length in the first direction of the piezoelectric body, T represents the thickness thereof, and $D=T/3$; wherein the second casing member is secured to the first casing member so as to cover the piezoelectric resonator bonded to the first casing member.

* * * * *